(12) United States Patent
Khalil

(10) Patent No.: US 7,636,650 B2
(45) Date of Patent: Dec. 22, 2009

(54) METHOD AND APPARATUS FOR AUTOMATING ELECTRICAL ENGINEERING CALCULATIONS

(75) Inventor: James M. Khalil, Delray Beach, FL (US)

(73) Assignee: Electric Power Calc Holdings, Inc., Delray Beach, FL (US)

( * ) Notice: Subject to any disclaimer, the term of this patent is extended or adjusted under 35 U.S.C. 154(b) by 855 days.

(21) Appl. No.: 10/280,610

(22) Filed: Oct. 25, 2002

(65) Prior Publication Data

US 2004/0060014 A1 Mar. 25, 2004

Related U.S. Application Data

(60) Provisional application No. 60/380,317, filed on Oct. 25, 2001.

(51) Int. Cl.
G06F 17/50 (2006.01)
(52) U.S. Cl. .......................................... 703/1
(58) Field of Classification Search ................ 700/97, 700/98, 286–298; 716/1, 5, 8, 9, 11; 703/1
See application file for complete search history.

(56) References Cited

U.S. PATENT DOCUMENTS

| | | | | |
|---|---|---|---|---|
| 5,050,091 | A * | 9/1991 | Rubin | 716/10 |
| 5,355,317 | A | 10/1994 | Talbott et al. | |
| 5,872,952 | A | 2/1999 | Tuan et al. | |
| 6,009,406 | A | 12/1999 | Nick | |
| 6,110,213 | A * | 8/2000 | Vinciarelli et al. | 703/1 |
| 6,305,000 | B1 | 10/2001 | Phan et al. | |
| 6,446,053 | B1 | 9/2002 | Elliott | |
| 6,847,853 | B1 * | 1/2005 | Vinciarelli et al. | 700/97 |
| 6,950,826 | B1 * | 9/2005 | Freeman | 707/102 |
| 2001/0018761 | A1 * | 8/2001 | Sasaki et al. | 716/15 |
| 2002/0035408 | A1 | 3/2002 | Smith | |
| 2002/0177981 | A1 * | 11/2002 | Fleming et al. | 703/1 |
| 2005/0120319 | A1 * | 6/2005 | van Ginneken | 716/6 |

OTHER PUBLICATIONS

C.Y. Teo et al., "Application of artificial intelligence in the design of low voltage electrical system", 2000, IEEE Power Engineering Society Winter Meeting 2000, vol. 3, pp. 1784-1789.*
Peter E. Sutherland et al., "A standard format for power system studies", Oct. 8, 2000, Conference record of the 2000 IEEE Industry Applications Conference, vol. 5, pp. 3194-3201.*

(Continued)

Primary Examiner—Paul L Rodriguez
Assistant Examiner—Russ Guill
(74) Attorney, Agent, or Firm—Brian K. Johnson, Esq., LLC

(57) ABSTRACT

A computer-based method and apparatus are provided for designing a building's electrical power distribution system. An electrical circuit design module accepts electrical requirements for individual circuits and automatically determines values for a set of variables that completely specify the design of the circuits and the physical attributes of the components needed to construct those circuits. The circuit design module determines the set of circuit variables with the aid of electrical standards data, such as the National Electrical Code. Further, multiple circuit design modules may be linked so as to share the data between them thereby providing an hierarchical design process where the design data for higher level electrical circuits is automatically determined from the plurality of individually specified, lower-level circuit data. Finally, the computer-based invention automatically generates an electrical parts inventory for constructing the electrical circuits in the building which may be electronically transmitted to a parts supplier for fulfillment.

36 Claims, 30 Drawing Sheets

OTHER PUBLICATIONS

Dapper Study Module, pages downloaded from the internet using the Internet Archive www.archive.org to access pages from www.skm.com dated Apr. 6, 2001, copyright 1997, seven pages.*

Joseph A. Ross et al., "The National Electric Code Handbook", 1983, second edition, National Fire Protection Association, pp. 85-104, 384-394.*

K. Brown et al., "Interactive simulation of power systems: ETAP applications and techniques", 1990, Conference record of the IEEE Industry Applications Society Annual Meeting, vol. 2, pp. 1930-1941.*

N.N. Bengiamin et al., "PC-Based power systems software: comparing functions and features", 1992, IEEE Computer Applications in Power, pp. 35-40.*

L.M. Tolbert, "Computer-aided coordination and overcurrent protection for distribution systems", 1995, 1995 IEEE Industrial and Commercial Power Systems Technical Conference, pp. 169-173.*

Speedi-Win screens, retrieved from the internet at www.geindustrial.com/publibrary/checkout/Software%7Cmerch_me%7CPDF, file creation date 1999, five unnumbered pages.*

Richard A. Fuselier, "NEC ampacity tables, circuit sizing, and developing standardized tables", 1990, IEEE Transactions on Industry Applications, vol. 26, No. 3, pp. 450-462.*

C.Y. Teo, "computer-aided design and simulation of low-voltage electrical distribution systems", Oct. 1997, Computers in Industry, vol. 34, Issue 1, pp. 87-94.*

"IEEE Recommended Practice for Industrial and Commercial Power Systems Analysis", 1998, Institute of Electrical and Electronics Engineers, pp. i-xiii, 1-483.*

R.E. Brown et al., "Automated primary distribution system design: reliability and cost optimization", 1996, Proceedings of the Transmission and Distribution Conference 1996, pp. 1-6.*

John H. Matthews, "Introduction to the design and analysis of building electrical systems", 1993, Springer, pp. 122-125, 154-160,164-171, 173-177, 210-215, 259-260.*

International Search Report from the PCT ISA/US Branch, International Application No. PCT/US02/34349, Mailed Oct. 23, 2003, 6 pp.

International Preliminary Examination Report from the PCT IPEA/US, International Application No. PCT/US02/34349, Mailed Sep. 9, 2004, 4 pp.

* cited by examiner

Branch Circuit Panelboard Standard Features

| Panel | Mains Rating | | AWG | GND | Conduit Size | | | | | | | | | Isolated Ground | Neutral Conductor Rating | (P) |
|---|---|---|---|---|---|---|---|---|---|---|---|---|---|---|---|---|
| 300 | AUTO | AUTO | MCB 1 | 1S / 350 | 2 | AUTO | AUTO | AUTO | | | | | | NO | 200% | AUTO |

| Phase | Phase | Phase | Load | | | Branch Circuit | | | | | MCB Options | TVSS | NEMA Designation | Isolated Ground | | | | Overcurrent Protection Device (OPCD) | | |
|---|---|---|---|---|---|---|---|---|---|---|---|---|---|---|---|---|---|---|---|---|
| A | B | C | kVA | FT | %VD | Sets | QTY | AWG | GND | C(In) | As Noted | YES | 1 | | Load Served | OPTN | Mg | P | Trip | CKT NO |
| 2.0 | | | 1.0 | 277 | 3.0% | 1 | 2 | 8 | 8 | 3/4 | | | | | RECEPTACLES | GFCI | R | 1 | 20 | 2 A |
| | 2.0 | | 1.0 | 108 | 3.0% | 1 | 2 | 12 | 12 | 3/4 | | | | | RECEPTACLES | | R | 1 | 20 | 4 A |
| | | 2.0 | 1.0 | 108 | 3.0% | 1 | 2 | 12 | 12 | 3/4 | | | | | RECEPTACLES | | R | 1 | 20 | 6 A |
| 5.0 | | | 4.0 | 110 | 3.0% | 1 | 2 | 6 | 10 | 3/4 | | | | | HEATER | | H | 2 | 50 | 8 A |
| | | | 4.0 | | 3.0% | | | | | | | | | | | | H | | | 10 A |
| | 7.0 | | 1.0 | | 3.0% | 1 | | | | | | | | | SPARE | HACR | S | 1 | 20 | 12 A |
| 4.2 | | 4.0 | (1.2) | 80 | 3.0% | 1 | 2 | 12 | 12 | 3/4 | | | | | FLOOR RECEPTACLES | | R | 1 | 20 | 14 A |
| | | | 1.0 | | 3.0% | 1 | | | | | | | | | SPARE | | S | | | 16 A |
| | 3.0 | | 1.0 | 72 | 3.0% | 1 | 4 | 10 | 10 | 3/4 | | | | | RECEPTACLES | | R | 1 | 20 | 18 A |
| | | 2.0 | 1.0 | | 3.0% | 1 | | | | | | | | | RECEPTACLES | | R | | | 20 A |
| 2.0 | | | 1.0 | | 3.0% | 1 | | | | | | | | | RECEPTACLES | | R | | | 22 A |
| | | 2.0 | 1.0 | | 3.0% | 1 | | | | | | | | | RECEPTACLES | | R | | | 24 A |
| 3.5 | 3.5 | | 2.5 | | 3.0% | 1 | | | | | | | | | AIR HANDLING UNIT | | H | 3 | 30 | 26 A |
| | | | 2.5 | | 3.0% | | | | | | | | | | | | H | | | 28 A |
| | | 3.5 | 2.5 | | 3.0% | | | | | | | | | | | | H | | | 30 A |
| 2.0 | | | 1.0 | | | | | | | | | | | | SPARE | | S | 1 | 20 | 32 A |
| | 2.0 | | 1.0 | | | | | | | | | | | | SPARE | | S | 1 | 20 | 34 A |
| | | 2.0 | 1.0 | | | | | | | | | | | | SPARE | | S | 1 | 20 | 36 A |
| 1.0 | | | | | | | | | | | | | | | SPACE | | | | | 38 A |
| | 1.0 | | | | | | | | | | | | | | SPACE | | | | | 40 A |
| | | 1.0 | | | | | | | | | | | | | SPACE | | | | | 42 A |

FIG. 4D

| | | | | |
|---|---|---|---|---|
| | | LOCK | Pad Lock Attachment | |
| GFP | Ground Fault Protection | SWD | Switch Duty Rated | |
| SNT | Shunt Trip | KEY | Key Lock | |
| HACR | Heating, Air Conditioning & Refrig. | OPTN | Options | |
| GFCI | Ground Fault Current Interrupter | | | |
| AIC | Ampere Interrupting Capacity | GND | Ground | |
| CU | Copper | LV | Low Voltage | |

| | | ELECTRIC POWER CALC INC. COPYRIGHT 2001-2002 |
|---|---|---|
| | | Power Calc Pak □ |
| | | Engineering application spreadsheet |
| | | www.powercalcpak.com |

| Total kVA Per Phase | | |
|---|---|---|
| 19.7 | 20.5 | 16.5 |

Analysis Notes

| Demand kVA | Note | |
|---|---|---|
| 3.8 | 1 | |
| | 2 | |
| 10.0 | 3 | NOTE - Panelboard LA is 200% rated neutral (N) conductor. Make sure to specify K-RATED transformer. |
| 1.6 | 4 | 1NOTE - Branch Circuit Conductor(s) Size of panel LA is NOT set on AUTO (A). Double check the result(s). |
| 11.3 | 5 | |
| 11.0 | 6 | |
| 15.5 | 7 | |
| | 8 | NOTE - Panelboard LA is active. |
| 5.0 | 9 | |
| | 10 | |
| | 11 | |
| 58.1 | | |

| LOAD No. | LIST | LIST | LIST | LIST &MACRO | Panel frame | Panel MAINS | mlo/mcb | # set | awg | TVSS | NEMA | bus | BUS macro | AIC | ISO GND | 200% n |
|---|---|---|---|---|---|---|---|---|---|---|---|---|---|---|---|---|
| | bkr # poles ZERO-3 | mounting | voltage | %VD | | | | | | | | | | | | |
| A | | AS NOTED | 480 | | AUTO | AUTO | MCB | AUTO | AUTO | YES | 1 | CU | 2 | 10,000 | YES | 100% |
| H | 1 | SURFACE | 208 | | 60 | 60 | MLO | 1 | 18 | NO | 2 | AL | | 14,000 | NO | 200% |
| L | 2 | RECESSED | 240 | AUTO | 100 | 70 | | 2 | 16 | | 3 | | | 18,000 | | |
| N | 3 | | | 1.0% | 125 | 80 | | 3 | 14 | | 3R | | | 20,000 | | |
| O | PANEL EXTRA LOAD | | | 1.5 | 200 | 90 | | 4 | 12 | | 3S | | | 22,000 | | |
| P | | | | 2.0% | 225 | 100 | | 5 | 10 | | 4 | | | 25,000 | | |
| R | Existing Electrical Load | | | 2.5% | 250 | 110 | | 6 | 8 | | 4X | | | 30,000 | | |
| S | Fed Through Load | | | 3.0% | 400 | 125 | | 7 | 6 | | 4XSS | | | 35,000 | | |
| | | | | 3.5% | 600 | 150 | | 8 | 4 | | 5 | | | 40,000 | | |
| | | | | 4.0% | 800 | 175 | | 9 | 3 | | 6 | | | 45,000 | | |
| | | | | 4.5% | 1000 | 200 | | 10 | 2 | | 6P | | | 50,000 | | |
| | | | | 5.0% | 1200 | 225 | | 11 | 1 | | 7 | | | 55,000 | | |
| | | | | AUTO | 1600 | 250 | | 12 | 1/0 | | 8 | | | 60,000 | | |
| | | | | | 2000 | 300 | | 13 | 2/0 | | 9 | | | 65,000 | | |
| | | | | | 2500 | 350 | | 14 | 3/0 | | 10 | | | 100,000 | | |
| | | | | | 3000 | 400 | | 15 | 4/0 | | 11 | | | 200,000 | | |
| | | | | | 4000 | 450 | | 16 | 250 | | 12 | | | | | |
| | | | | | AUTO | 500 | | 17 | 300 | | 12K | | | | | |
| | | | | | | 600 | | 18 | 350 | | 13 | | | | | |
| | | | | | | 700 | | 19 | 400 | | | | | | | |
| | | | | | | 800 | | 20 | 500 | | | | | | | |
| | | | | | | 1000 | | AUTO | 600 | | | | | | | |
| | | | | | | 1200 | | | 700 | | | | | | | |
| | | | | | | 1600 | | | 750 | | | | | | | |
| | | | | | | 2000 | | | 800 | | | | | | | |
| | | | | | | 2500 | | | 900 | | | | | | | |
| | | | | | | 3000 | | | 1000 | | | | | | | |
| | | | | | | 4000 | | | 1250 | | | | | | | |
| | | | | | | AUTO | | | 1500 | | | | | | | |
| | | | | | | | | | 1750 | | | | | | | |
| | | | | | | | | | 2000 | | | | | | | |

FIG. 5B

| Poles | AWG BRANCH CKT ┌362 | BRANCH BKR OPTION | MCB OPTIONS | Interrupting ratings ┌322 | # SET VS DEMAND AMPS | | | | GND AWG | CONDUITS size | Correction Factor ┌380 | | | |
|---|---|---|---|---|---|---|---|---|---|---|---|---|---|---|
| | | | | | 1.000000 | 1 | 1 | 1 | | | | AUTO | | |
| AUTO | A | | SNT | Fully Rated | 0.050000 | 20 | 1 | 1 | | AUTO | AUTO | | | |
| 6 | 16 | SWD | As Noted | Series Rated | 0.040000 | 25 | 1 | 1 | AUTO | 1/2 | 30 | 9 | 1 | 130 |
| 12 | 14 | SNT | GFP | As Noted | 0.033333 | 30 | 1 | 1 | 12 | 3/4 | 35 | 15 | 2 | 115 |
| 18 | 12 | KEY | | | 0.028571 | 35 | 1 | 1 | 8 | 1 | 40 | 30 | 3 | 100 |
| 24 | 10 | GFCI | | | 0.025000 | 40 | 1 | 1 | 8 | 1 1/4 | 45 | 45 | 4 | 85 | 120 | FALSE |
| 30 | 8 | HACR | | | 0.022222 | 45 | 1 | 1 | 6 | 1 1/2 | 50 | 75 | 6 | 65 | 120 | FALSE |
| 36 | 6 | LV | | | 0.020000 | 50 | 1 | 1 | 4 | 2 | 55 | 112.5 | 8 | 80 | 120 | FALSE |
| 42 | 4 | | | | 0.016667 | 60 | 1 | 1 | 3 | 2 1/2 | 60 | 150 | 10 | 35 | 120 | FALSE |
| AUTO | 3 | | | | 0.014286 | 70 | 1 | 1 | 2 | 3 | 70 | 225 | 12 | 20 | 120 | FALSE |
| | 2 | | | | 0.012500 | 80 | 1 | 1 | 1 | 3 1/2 | 80 | 300 | 14 | | 120 | FALSE |
| | 2 | | | | 0.011111 | 90 | 1 | 1 | 1/0 | 4 | AUTO | 500 | 16 | | 120 | FALSE |
| | 1/0 | | | | 0.010000 | 100 | 1 | 1 | 2/0 | 5 | | | 18 | | 120 | FALSE |
| | 2/0 | | | | 0.009091 | 110 | 1 | 1 | 3/0 | 6 | | | 250 | 255 | 120 | FALSE |
| | 3/0 | | | | 0.008000 | 125 | 1 | 1 | 4/0 | | | | 300 | 285 | 120 | FALSE |
| | 4/0 | | | | 0.006667 | 150 | 1 | 1 | 250 | | | | 350 | 310 | 120 | FALSE |
| | 250 | | | | 0.005714 | 175 | 1 | 1 | 300 | | | | 400 | 335 | 120 | FALSE |
| | 300 | | | | 0.005000 | 200 | 1 | 1 | 350 | | | | 500 | 380 | 120 | FALSE |
| | 350 | | | | 0.004444 | 225 | 1 | 1 | 400 | | | | 600 | 420 | 120 | FALSE |
| | 400 | | | | 0.004000 | 250 | 1 | 1 | 500 | | | | 700 | 460 | 120 | FALSE |
| | 500 | | | | 0.003333 | 300 | 1 | 2 | 300.0 | 600 | | | 750 | 475 | 120 | FALSE |
| | | | | | 0.002857 | 350 | 1 | 2 | 350.0 | 700 | | | 800 | 490 | 120 | FALSE |
| | | | | | 0.002500 | 400 | 2 | 2 | 200.0 | 750 | | | 900 | 520 | 120 | FALSE |
| | | | | | 0.002222 | 450 | 2 | 3 | 225.0 | 800 | | | 1000 | 545 | 120 | FALSE |
| | | | | | 0.002000 | 500 | 2 | 3 | 250.0 | 900 | | | 1250 | 590 | 120 | FALSE |
| | | | | | 0.001667 | 600 | 2 | 3 | 300.0 | 1000 | | | 1500 | 625 | 120 | FALSE |
| | | | | | 0.001429 | 700 | 2 | 3 | 350.0 | 1250 | | | 1750 | 650 | | |
| | | | | | 0.001250 | 800 | 3 | 3 | 266.7 | 1500 | | | 2000 | 665 | | |
| | | | | | 0.001000 | 1000 | 3 | 4 | 333.3 | 1750 | | | 1/0 | 150 | | |
| | | | | | 0.000833 | 1200 | 4 | 4 | 300.0 | | | | 2/0 | 175 | | |
| | | | | | 0.000625 | 1600 | 5 | 5 | 320.0 | | | | 3/0 | 200 | | |
| | | | | | 0.000500 | 2000 | 6 | 6 | 333.3 | | | | | | | |
| | | | | | 0.000400 | 2500 | 8 | | | | | | 4/0 | 230 | | |
| | | | | | 0.000333 | 3000 | 10 | 9 | 300.0 | | | | | | | |
| | | | | | 0.000250 | 4000 | 12 | 11 | 333.3 | | | | | | | |
| | | | | | 0.000200 | 5000 | 13 | 13 | 384.6 | | | | | | | |
| | | | | | 0.000167 | 6000 | 16 | 14 | 375.0 | | | | | | | |

| MDP | 1 | DP2 | DP3 | DP4 | DP5 | DP6 | Branch Circuit Panelboard Characteristics | | AUTO | AUTO |
|---|---|---|---|---|---|---|---|---|---|---|
| | DP1 | | | | | | | | | |

| Panelboard Designation | Mounting Method | Interrupting Ratings | AIC Rating | Phase (PH) | PH-PH | PH-N | FT | %VD | Panel Frame |
|---|---|---|---|---|---|---|---|---|---|
| HA | SURFACE | Fully Rated | 20,000 | 3 | 480 | 277 | 237 | 2.0% | 400 |

| Overcurrent Protection Device (OPD) | | | | | Load Served | Branch Circuit | | | | | | Load |
|---|---|---|---|---|---|---|---|---|---|---|---|---|
| CKT NO | Trip | P | Mc | OPTN | | Sets | QTY | AWG | GND | C (In) | %VD | FT | kVA |
| A | 1 | 20 | 1 | L | SWD | LIGHTING ROOM 105 | 1 | 2 | 12 | 12 | 3/4 | 3.0% | 288 | 2.0 |
| A | 3 | 20 | 1 | L | SWD | LIGHTING ROOM 106 | 1 | 2 | 12 | 12 | 3/4 | 3.0% | 288 | 2.0 |
| A | 5 | 20 | 1 | L | SWD | LIGHTING ROOM 107 | 1 | 2 | 12 | 12 | 3/4 | 3.0% | 288 | 2.0 |
| A | 7 | 20 | 1 | L | SWD | LIGHTING ROOM 108 | 1 | 2 | 12 | 12 | 3/4 | 3.0% | 288 | 2.0 |
| A | 9 | 20 | 1 | L | | LIGHTING ROOM 109 | 1 | 2 | 12 | 12 | 3/4 | 3.0% | 288 | 2.0 |
| A | 11 | 20 | 1 | L | | LIGHTING ROOM 110 | 1 | 2 | 12 | 12 | 3/4 | 3.0% | 288 | 2.0 |
| A | 13 | 20 | 1 | L | | LIGHTING ROOM 111 | 1 | 2 | 12 | 12 | 3/4 | 3.0% | 288 | 2.0 |
| A | 15 | 20 | 1 | L | | LIGHTING ROOM 112 | 1 | 2 | 12 | 12 | 3/4 | 3.0% | 288 | 2.0 |
| A | 17 | 20 | 1 | L | | LIGHTING ROOM 113 | 1 | 2 | 12 | 12 | 3/4 | 3.0% | 288 | 2.0 |
| A | 19 | 20 | 1 | L | | LIGHTING ROOM 114 | 1 | 2 | 12 | 12 | 3/4 | 3.0% | 288 | 2.0 |
| A | 21 | 20 | 1 | L | | LIGHTING ROOM 115 | 1 | 2 | 12 | 12 | 3/4 | 3.0% | 288 | 2.0 |
| A | 23 | 20 | 1 | L | | LIGHTING ROOM 116 | 1 | 2 | 12 | 12 | 3/4 | 3.0% | 288 | 2.0 |
| A | 25 | 20 | 1 | L | | LIGHTING ROOM 117 | 1 | 2 | 12 | 12 | 3/4 | 3.0% | 288 | 2.0 |
| A | 27 | 20 | 1 | L | | LIGHTING ROOM 118 | 1 | 2 | 12 | 12 | 3/4 | 3.0% | 288 | 2.0 |
| A | 29 | 20 | 1 | L | | LIGHTING ROOM 119 | 1 | 2 | 12 | 12 | 3/4 | 3.0% | 288 | 2.0 |
| A | 31 | 20 | 1 | L | | LIGHTING ROOM 120 | 1 | 2 | 12 | 12 | 3/4 | 3.0% | 288 | 2.0 |
| A | 33 | 20 | 1 | L | KEY | EMERGENCY LIGHTING | 1 | 2 | 12 | 12 | 3/4 | 3.0% | 288 | 2.0 |
| A | 35 | 20 | 1 | L | KEY | EMERGENCY LIGHTING | 1 | 2 | 12 | 12 | 3/4 | 3.0% | 288 | 2.0 |
| A | 37 | 20 | 1 | S | | SPARE | 1 | | | | | 3.0% | | 2.0 |
| A | 39 | 20 | 1 | S | | SPARE | 1 | | | | | 3.0% | | 2.0 |
| A | 41 | 20 | 1 | S | | SPARE | 1 | | | | | 3.0% | | 2.0 |

| Load | kVA | Ampere | | Feeder Ampacity |
|---|---|---|---|---|
| Connected | 183.1 | 220.2 | | Amps |
| Calculated Demand | 194.8 | 234.3 | | 310 |

| Project Name | PATENT APPLICATION | Project No. | 123456789.0000 |
|---|---|---|---|
| Project Phase – Date | FINAL | Engineer | |

| Mc | Description | Load kVA | Future Load kVA | Default Demand Factor | Override Demand Factor | kVA |
|---|---|---|---|---|---|---|
| M | Largest Motor Load | 21.0 | | 125% | | 26.3 |
| M | Remaining Motor Load | | | 100% | | |
| R | First 10 kVA of Receptacle Load | | | 100% | | |
| R | Remaining Receptacle Load | | | 50% | | |
| L | Lighting Load | 51.1 | | 125% | | 63.9 |
| P | Power Load | 81.0 | | 100% | | 81.0 |
| H | Climate Control Heating Load | 9.0 | | 30% | | 2.7 |
| A | Climate Control Cooling Load | 15.0 | | 100% | | 15.0 |
| S | Spare | 6.0 | | 100% | | 6.0 |
| O | Other Load | | | 100% | | |
| SELECT | Fed Through Load | | | | | |
| | TOTAL | 183.1 | | | | 194.8 |

FIG. 6B

| AUTO (547) | AUTO (539) | AUTO (548) | AUTO (558) | AUTO (542) | AUTO (544) | AUTO (546) | Branch Circuit Panelboard Standard Features | | | | | | |
|---|---|---|---|---|---|---|---|---|---|---|---|---|---|
| Panel Name Rating | Bus | AWG | Gnd | Conduit Size | Correction Factor (T) | Bus Mat | Main Lugs Only | TVSS | NEMA Designation | Isolated Ground | Neutral Conductor Rating | Poles (P) | |
| 300 | 11.0 | 1 | 4 | 350 | 4 | 3 1/2 in | 30 | 1 | CU | | YES | 1 | NO | 100% | AUTO |

| Phase A | Phase B | Phase C | Load kVA | Branch Circuit | | | | | | Load Served | Overcurrent Protection Device (OPD) | | | | |
|---|---|---|---|---|---|---|---|---|---|---|---|---|---|---|---|
| | | | | FT | %VD | Sets | QTY | AWG | GND | C(in) | | OPTN | Mc | P | Trip | CKT NO |
| 3.0 | | | 3.0 | 192 | 3.0% | 1 | 4 | 12 | 12 | 3/4 | AHU 2 | H | 3 | 20 | 2 | A |
| | 3.0 | | 3.0 | | 3.0% | 1 | | | | | | H | | | 4 | A |
| | | 3.0 | 3.0 | | 3.0% | 1 | | | | | | H | | | 6 | A |
| 7.0 | | | 5.0 | 192 | 3.0% | 1 | 4 | 10 | 10 | 3/4 | CU 2 | A | 3 | 45 | 8 | A |
| | 7.0 | | 5.0 | | 3.0% | 1 | | | | | | A | | | 10 | A |
| | | 7.0 | 5.0 | | 3.0% | 1 | | | | | | A | | | 12 | A |
| 9.0 | | | 7.0 | 211 | 3.0% | 1 | 4 | 8 | 10 | 1 | CIRCULATING PUMP | H | 3 | 60 | 14 | A |
| | 9.0 | | 7.0 | | 3.0% | 1 | | | | | | H | | | 16 | A |
| | | 9.0 | 7.0 | | 3.0% | 1 | | | | | | H | | | 18 | A |
| 4.5 | | | 2.5 | 230 | 3.0% | 1 | 2 | 12 | 12 | 3/4 | EXTERIOR LIGHTING | L | 1 | 20 | 20 | A |
| | 4.5 | | 2.5 | 230 | 3.0% | 1 | 2 | 12 | 12 | 3/4 | EXTERIOR LIGHTING | L | 1 | 20 | 22 | A |
| | | 4.5 | 2.5 | 230 | 3.0% | 1 | 2 | 12 | 12 | 3/4 | EXTERIOR LIGHTING | L | 1 | 20 | 24 | A |
| 27.0 | | | 25.0 | 354 | 3.0% | 1 | 4 | 1/0 | 6 | 2 | PANEL LB | P | 3 | 125 | 26 | A |
| | 27.0 | | 25.0 | | 3.0% | 1 | | | | | | P | | | 28 | A |
| | | 27.0 | 25.0 | | 3.0% | 1 | | | | | | P | | | 30 | A |
| 5.6 | | | 3.6 | 160 | 3.0% | 1 | 2 | 12 | 12 | 3/4 | LIGHTING ROOM 1122 | L | 1 | 20 | 32 | A |
| | 4.0 | | 2.0 | 288 | 3.0% | 1 | 2 | 12 | 12 | 3/4 | LIGHTING ROOM 1123 | L | 1 | 20 | 34 | A |
| | | 4.0 | 2.0 | 288 | 3.0% | 1 | 2 | 12 | 12 | 3/4 | LIGHTING ROOM 1124 | L | 1 | 20 | 36 | A |
| 4.0 | | | 2.0 | 288 | 3.0% | 1 | 4 | 12 | 12 | 3/4 | WATER HEATER | P | 3 | 20 | 38 | A |
| | 4.0 | | 2.0 | | 3.0% | 1 | | | | | | P | | | 40 | A |
| | | 4.0 | 2.0 | | 3.0% | 1 | | | | | | P | | | 42 | A |

| Total kVA Per Phase | | |
|---|---|---|
| 62.1 | 60.5 | 60.5 |

| GFP | Ground Fault Protection |
| SNT | Shunt Trip |
| HACR | Heating, Air Conditioning & Refrig. |
| GFCI | Ground Fault Current Interrupter |
| AIC | Ampere Interrupting Capacity |
| CU | Copper |

| LOCK | Pad Lock Attachment |
| SWD | Switch Duty Rated |
| KEY | Key Lock |
| OPTN | Options |
| GND | Ground |
| LV | Low Voltage |

ELECTRIC POWER CALC INC.
COPYRIGHT 2001-2002
Power Calc Pak
Engineering application
spreadsheet
www.powercalcpak.com

| Note | Analysis Notes |
|---|---|
| 1 | |
| 2 | |
| 3 | NOTE - Panelboard HA is 100% rated neutral conductor. |
| 4 | NOTE - All Branch Circuit Conductors are set on AUTO (A). |
| 5 | |
| 6 | |
| 7 | |
| 8 | NOTE - Panelboard HA is active. |
| 9 | |
| 10 | |
| 11 | |

| Load | kVA | Ampere | | Feeder Ampacity | |
|---|---|---|---|---|---|
| Connected | 502.0 | 609.8 | | | |
| Calculated Demand | 502.5 | 604 | | | 653.0 |
| Service Transformer | | | | | |
| Project Name | | PATENT APPLICATION | | Project No. | 123456789.0000 |
| Submittal Phase & Date | FINAL | | | Engineer | |

630 brackets the top section. 685 points to the Ampere header area.

| Mc | Description | Connected Load (kVA) | Future Load (kVA) | Default Demand Factor | Override Demand Factor |
|---|---|---|---|---|---|
| M | Largest Motor Load | 2.0 | | 125% | |
| M | Remaining Motor Load | | | 100% | |
| L | Lighting Load | | | 125% | |
| P | Power Load | | | 100% | |
| H | Climate Control Heating Load | | | 100% | |
| A | Climate Control Cooling Load | | | 30% | |
| S | Spare | 35.0 | | 100% | |
| O | Other Load | | | 100% | |
| | Power Distribution Load | 465.0 | | 100% | |
| | | | | | |
| | TOTAL | 502.0 | | | |

681 points to TOTAL row. 682, 684, 686 bracket columns below.

| Project Name | | | | | | | | | Project Number | | 123,456,789 | BLDG Total Area | | 1,000 | |
|---|---|---|---|---|---|---|---|---|---|---|---|---|---|---|---|
| Building Name | | | | | | | | | Submittal Phase | | FINAL | Submittal Date | | | |
| Distribution Voltage | Phase | MOP | OP1 | OP2 | OP3 | OP4 | OP5 | OP6 | | | Building Equipment | | | | |
| 480 | 3 | | 1 | | | | | | | | RESULTS | | | | |
| Building Equipment Item | Select | Select | Select | Select | ENTER | Select | Select | ENTER | Calculated FLC Based On : | | | Cooling & Heating Cycles Electrical Load | | | |
| | (CU) | 3 or 4 Wires | Load Type | PH-PH Volt | Phase | Published kVA | Horse Power | "H" for HTG | Published Motor FLC | NEC | Motor Published kVA | Cooling Cycle | Heating Cycle | Cooling Cycle | Heating Cycle |
| NO. | Components | 3 | | Volt | | kVA | HP | | Amps | Amps | Amps | Amps | Amps | kVA | kVA |
| 1 | COMPRESSOR 1 | | MTR | 480 | 3 | | 25 | | | 34.00 | | 34.00 | | 28.3 | |
| 2 | COMPRESSOR 2 | | MTR | 480 | 3 | | 60 | | | 77.00 | | 77.00 | | 64.0 | |
| 3 | CONDENSER FAN 1 | | MTR | 208 | 1 | | 1/3 | | | 4.00 | | 4.00 | | 0.8 | |
| 4 | CONDENSER FAN 2 | | MTR | 208 | 1 | | 1/6 | | | 2.40 | | 2.40 | | 0.5 | |
| 5 | | | | | | | | | | | | | | | |
| 6 | | | | | | | | | | | | | | | |
| 7 | | | | | | | | | | | | | | | |
| 8 | | | | | | | | | | | | | | | |
| 9 | | | | | | | | | | | | | | | |
| 10 | | | | | | | | | | | | | | | |
| 11 | | | | | | | | | | | | | | | |
| 12 | | | | | | | | | | | | | | | |
| 13 | | | | | | | | | | | | | | | |
| 14 | | | | | | | | | | | | | | | |
| 15 | | | | | | | | | | | | | | | |
| | | | | | | | | | | Total | | 117.4 | | 93.6 | |

815 points to row 1 (COMPRESSOR 1)

| Calculations | AUTO | AUTO | AUTO | AUTO | AUTO | AUTO | RK 5 | AUTO | AUTO | AUTO | 3R | | | |
|---|---|---|---|---|---|---|---|---|---|---|---|---|---|---|
| | No. of Sets | No. of Wires | Feeder (AWG) | GND (AWG) | Conduit Size (in) | Fuse OPD (Amps) | UL Fuse Class | Fuse Disc. Frame | Breaker OPD (Amps) | Breaker Disc. Frame | Enclosure NEMA | | | |
| Cooling Cycle | 1 | 3 | 1/0 | 4 | 2 | 175 | | 200 | 225 | 400 | | | | |
| RESULTS | 1 | 3 | 1/0 | 4 | 2 | 175 | RK 5 | 200 | 225 | 400 | 3R | | | |

832 points to RESULTS row

| | Engineer's Notes |
|---|---|
| 1 | When applicable, the user should indicate both the starter size and type of starter on the construction document. Refer to user's manual. |
| 2 | |
| 3 | |
| 4 | |
| 5 | |
| 6 | |
| 7 | |
| 8 | |
| 9 | |
| 10 | |
| 11 | |
| 12 | |
| 13 | |
| 14 | |
| 15 | |

△ OUTPUT
○ INPUT
} REGION/GROUP

| Main Distribution Panelboard Characteristics | | | | | | | | | | AUTO | AUTO |
|---|---|---|---|---|---|---|---|---|---|---|---|

| Panelboard Designation | Mounting Method | Interrupting Ratings | A/C Rating | Phase (PH) | PH-PH | PH-N | FT | %VD | Frame | | |
|---|---|---|---|---|---|---|---|---|---|---|---|
| MDP | SURFACE | Fully Rated | 65,000 | 3 | 480 | 277 | 25 | 3.0% | 1000 | | |

| Overcurrent Protection Device (OPD) | | | | Load Served | Branch Circuit | | | | | | |
|---|---|---|---|---|---|---|---|---|---|---|---|
| CKT NO. | Trip | P | Mc | OPTN | | Sets | QTY | AWG | GND | C (in) | %VD | FT | kVA |

| CKT | Trip | P | Mc | OPTN | Load Served | Sets | QTY | AWG | GND | C(in) | %VD | FT | kVA |
|---|---|---|---|---|---|---|---|---|---|---|---|---|---|
| A | 1 | | | | SPACE | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | | | | | | | | | |
| A | | | | | 480 | | | | | | | | |
| A | | | | | | | | | | | | | |
| A | | | | | | | | | | | | | |
| A | | | | | | | | | | | | | |
| A | (3) | (800) | (3) | | (DP1) | (480) | (3) | (4) | (300) | (1/0) | (3) | (2.0%) | (281) | (502.5) |
| A | | | | | | | | | | | | | |
| A | /5\ | /25\ | (3) | M | ELEVATOR | 1 | /4\ | /10\ | /4\ | /2\ | 2.0% | 19\ | 60.0 |
| A | | | | | | 1 | | | | | | | |
| A | | | | | | 1 | | | | | | | |
| A | | | | | | 1 | | | | | | | |
| A | | | | | | 1 | | | | | | | |
| A | | | | | | 1 | | | | | | | |

| Load | kVA | Ampere | | Feeder Ampacity | |
|---|---|---|---|---|---|
| Connected | 642.5 | 772.8 | | | |
| Calculated Demand | 665.0 | 799.9 | | 1020.0 | |
| Service Transformer AUTO | 750.0 | 902.1 | | | |

| Project Name | PATENT APPLICATION | Project No. | 123456789.0000 |
|---|---|---|---|
| Submittal Phase & Date | FINAL | Engineer | |

| Mc | Description | Connected Load (kVA) | Future Load (kVA) | Default Demand Factor | Override Demand Factor |
|---|---|---|---|---|---|
| M | Largest Motor Load | 90.0 | | 125% | |
| M | Remaining Motor Load | 50.0 | | 100% | |
| L | Lighting Load | | | 125% | |
| P | Power Load | | | 100% | |
| H | Climate Control Heating Load | | | 100% | |
| A | Climate Control Cooling Load | | | 30% | |
| S | Spare | | | 100% | |
| O | Other Load | | | 100% | |
| | Power Distribution Load | 502.5 | | 100% | |
| | | | | | |
| | TOTAL | 642.5 | | | |

FIG. 11

| FUSE NEC 240-6 STD AMPS RATINGS | BREAKER | NEC 240-6 STD | BREAKER | 1/AMPS RATING |
|---|---|---|---|---|
| 2 | 20 | 0.0001667 | 6000 | 0.0001667 |
| 4 | 20 | 0.0002000 | 5000 | 0.0002000 |
| 6 | 20 | 0.0002500 | 4000 | 0.0002500 |
| 8 | 20 | 0.0003333 | 3000 | 0.0003333 |
| 10 | 20 | 0.0004000 | 2500 | 0.0004000 |
| 12 | 20 | 0.0005000 | 2000 | 0.0005000 |
| 16 | 20 | 0.0006250 | 1600 | 0.0006250 |
| 18 | 20 | 0.0008333 | 1200 | 0.0008333 |
| 20 | 20 | 0.0010000 | 1000 | 0.0010000 |
| 25 | 25 | 0.0012500 | 800 | 0.0012500 |
| 30 | 30 | 0.0014286 | 700 | 0.0014286 |
| 35 | 35 | 0.0016667 | 600 | 0.0016667 |
| 40 | 40 | 0.0020000 | 500 | 0.0020000 |
| 45 | 45 | 0.0025000 | 400 | 0.0025000 |
| 50 | 50 | 0.0028571 | 350 | 0.0028571 |
| 60 | 60 | 0.0033333 | 300 | 0.0033333 |
| 70 | 70 | 0.0040000 | 250 | 0.0040000 |
| 80 | 80 | 0.0044444 | 225 | 0.0044444 |
| 90 | 90 | 0.0050000 | 200 | 0.0050000 |
| 100 | 100 | 0.0057143 | 175 | 0.0057143 |
| 110 | 110 | 0.0066667 | 150 | 0.0066667 |
| 125 | 125 | 0.0080000 | 125 | 0.0080000 |
| 150 | 150 | 0.0090909 | 110 | 0.0090909 |
| 175 | 175 | 0.0100000 | 100 | 0.0100000 |
| 200 | 200 | 0.0111111 | 90 | 0.0111111 |
| 225 | 225 | 0.0125000 | 80 | 0.0125000 |
| 250 | 250 | 0.0142857 | 70 | 0.0142857 |
| 300 | 300 | 0.0166667 | 60 | 0.0166667 |
| 350 | 350 | 0.0200000 | 50 | 0.0200000 |
| 400 | 400 | 0.0222222 | 45 | 0.0222222 |
| 500 | 500 | 0.0250000 | 40 | 0.0250000 |
| 600 | 600 | 0.0285714 | 35 | 0.0285714 |
| 700 | 700 | 0.0333333 | 30 | 0.0333333 |
| 800 | 800 | 0.0400000 | 25 | 0.0400000 |
| 1000 | 1000 | 0.0500000 | 20 | 0.0500000 |
| 1200 | 1200 | 0.0500000 | 20 | 0.0500000 |
| 1600 | 1600 | | | |
| 2000 | 2000 | | | |
| 2500 | 2500 | | | |
| 3000 | 3000 | | | 1010 |
| 4000 | 4000 | | | |
| 5000 | 5000 | | | |
| 6000 | 6000 | | | |

RECOMMENDED CKT BKR OVER RIDDEN

FIG. 12

| TABLE 310-16 | 74 DEG | | 90 DEG | |
|---|---|---|---|---|
| AMPS | AWG | | AMPS | AWG |
| | | | | |
| | 16 | | 14 | 18 |
| | 18 | | 18 | 16 |
| 20 | 14 | | 25 | 14 |
| 20 | 12 | | 30 | 12 |
| 30 | 10 | | 40 | 10 |
| 40 | 8 | | 55 | 8 |
| 55 | 6 | | 75 | 6 |
| 70 | 4 | | 95 | 4 |
| 85 | 3 | | 110 | 3 |
| 95 | 2 | | 130 | 2 |
| 110 | 1 | | 150 | 1 |
| 150 | 1/0 | | 170 | 1/0 |
| 175 | 2/0 | | 195 | 2/0 |
| 200 | 3/0 | | 225 | 3/0 |
| 230 | 4/0 | | 260 | 4/0 |
| 255 | 250 | | 290 | 250 |
| 285 | 300 | | 320 | 300 |
| 310 | 350 | | 350 | 350 |
| 335 | 400 | | 380 | 400 |
| 400 | 500 | ADJUSTED | 430 | 500 |
| 420 | 600 | | 475 | 600 |
| 460 | 700 | | 520 | 700 |
| 475 | 750 | | 535 | 750 |
| 490 | 800 | | 555 | 800 |
| 520 | 900 | | 585 | 900 |
| 545 | 1000 | | 615 | 1000 |
| 590 | 1250 | | 665 | 1250 |
| 635 | 1500 | | 705 | 1500 |
| 650 | 1750 | | 735 | 1750 |
| 665 | 2000 | | 750 | 2000 |

| TAB 310-16 | 75 DEG | | AC RESISTANCE FOR UNCOATED CU. WIRES | | | MAX R | TAB 310-16 | 90 DEG |
|---|---|---|---|---|---|---|---|---|
| AWG | AMPS | AREA(IN) | PVC | AL | STEEL | | AWG | AMPS |
| 1 | 130 | 0.1590 | 0.1600 | 0.1600 | 0.1600 | 0.1600 | 1 | 150 |
| 2 | 115 | 0.1182 | 0.1900 | 0.2000 | 0.2000 | 0.2000 | 2 | 130 |
| 3 | 100 | 0.0995 | 0.2500 | 0.2500 | 0.2500 | 0.2500 | 3 | 110 |
| 4 | 85 | 0.0845 | 0.3100 | 0.3100 | 0.3100 | 0.3100 | 4 | 95 |
| 6 | 65 | 0.0519 | 0.4900 | 0.4900 | 0.4900 | 0.4900 | 6 | 75 |
| 8 | 50 | 0.0373 | 0.7800 | 0.7800 | 0.7800 | 0.7800 | 8 | 55 |
| 10 | 35 | 0.0184 | 1.2000 | 1.2000 | 1.2000 | 1.2000 | 10 | 40 |
| 12 | 25 | 0.0117 | 2.0000 | 2.0000 | 2.0000 | 2.0000 | 12 | 30 |
| 14 | 20 | 0.0087 | 3.1000 | 3.1000 | 3.1000 | 3.1000 | 14 | 25 |
| 16 | | 0.0097 | | | | | 16 | 18 |
| 18 | | 0.0062 | | | | | 18 | 14 |
| 250 | 255 | 0.4026 | 0.0520 | 0.0570 | 0.0540 | 0.0570 | 250 | 290 |
| 300 | 285 | 0.4669 | 0.0440 | 0.0490 | 0.0459 | 0.0490 | 300 | 320 |
| 350 | 310 | 0.5387 | 0.0500 | 0.0380 | 0.0430 | 0.0500 | 350 | 350 |
| 400 | 335 | 0.5931 | 0.0330 | 0.0380 | 0.0350 | 0.0380 | 400 | 380 |
| 500 | 400 | 0.7163 | 0.0270 | 0.0320 | 0.0290 | 0.0320 | 500 | 430 |
| 600 | 420 | 0.8791 | 0.0230 | 0.0280 | 0.0250 | 0.0280 | 600 | 475 |
| 700 | 460 | 1.0011 | 0.0230 | 0.0280 | 0.0250 | 0.0280 | 700 | 520 |
| 750 | 475 | 1.0623 | 0.0190 | 0.0240 | 0.0210 | 0.0240 | 750 | 535 |
| 800 | 490 | 1.1234 | 0.0190 | 0.0240 | 0.0210 | 0.0240 | 800 | 555 |
| 900 | 520 | 1.2449 | 0.0190 | 0.0240 | 0.0210 | 0.0240 | 900 | 585 |
| 1000 | 545 | 1.3623 | 0.0150 | 0.0190 | 0.0180 | 0.0190 | 1000 | 615 |
| 1250 | 590 | 1.9532 | NO | NO | NO | | 1250 | 665 |
| 1500 | 635 | NO | NO | NO | NO | | 1500 | 705 |
| 1750 | 650 | 2.5930 | NO | NO | NO | | 1750 | 735 |
| 2000 | 665 | 2.9013 | NO | NO | NO | | 2000 | 750 |
| 1/0 | 150 | 0.1893 | 0.1286 | 0.1380 | 0.1290 | 0.1300 | 1/0 | 170 |
| 2/0 | 175 | 0.2265 | 0.1090 | 0.1000 | 0.1000 | 0.1000 | 2/0 | 195 |
| 3/0 | 200 | 0.2715 | 0.0770 | 0.6820 | 0.0790 | 0.0820 | 3/0 | 225 |
| 4/0 | 230 | 0.3278 | 0.0620 | 0.6670 | 0.0630 | 0.0670 | 4/0 | 260 |

| AMPS | TABLE 250-66 NEC 1999 | | | TABLE 250-122 (NEC 1999) | | |
|---|---|---|---|---|---|---|
| | AWG | GND WIRE (CU) | GND WIRE (AL) | BREAKER | CU AWG | AL AWG |
| | | | | | | |
| 110 | 1 | 6 | 4 | 15 | 14 | 12 |
| 95 | 2 | 8 | 6 | 20 | 12 | 10 |
| 85 | 3 | 8 | 6 | 25 | 10 | 8 |
| 70 | 4 | 8 | 6 | 30 | 10 | 8 |
| 55 | 6 | 8 | 6 | 35 | 10 | 8 |
| 40 | 8 | 8 | 6 | 40 | 10 | 8 |
| 30 | 10 | 8 | 6 | 45 | 10 | 8 |
| 20 | 12 | 8 | 6 | 50 | 10 | 8 |
| 20 | 14 | 8 | 6 | 60 | 10 | 8 |
| | 16 | 8 | 6 | 70 | 8 | 6 |
| | 18 | 8 | 6 | 80 | 8 | 6 |
| 255 | 250 | 2 | 1/0 | 90 | 8 | 6 |
| 285 | 300 | 2 | 1/0 | 100 | 8 | 6 |
| 310 | 350 | 2 | 1/0 | 110 | 6 | 4 |
| 335 | 400 | 1/0 | 3/0 | 125 | 6 | 4 |
| 400 | 500 | 1/0 | 3/0 | 150 | 6 | 4 |
| 420 | 600 | 1/0 | 3/0 | 175 | 6 | 4 |
| 460 | 700 | 2/0 | 4/0 | 200 | 6 | 4 |
| 475 | 750 | 2/0 | 4/0 | 225 | 4 | 2 |
| 490 | 800 | 2/0 | 4/0 | 250 | 4 | 2 |
| 520 | 900 | 2/0 | 4/0 | 300 | 4 | 2 |
| 545 | 1000 | 2/0 | 4/0 | 350 | 4 | 2 |
| 590 | 1250 | 3/0 | 250 | 400 | 3 | 1 |
| 635 | 1500 | 3/0 | 250 | 500 | 2 | 1/0 |
| 650 | 1750 | 3/0 | 250 | 600 | 1 | 2/0 |
| 665 | 2000 | 3/0 | 250 | 700 | 1 | 3/0 |
| 150 | 1/0 | 6 | 4 | 800 | 1/0 | 3/0 |
| 175 | 2/0 | 4 | 2 | 1000 | 2/0 | 4/0 |
| 200 | 3/0 | 4 | 2 | 1200 | 3/0 | 250 |
| 230 | 4/0 | 2 | 1/0 | 1600 | 4/0 | 350 |
| | | | | 2000 | 250 | 400 |
| | | | | 2500 | 350 | 600 |
| | | | | 3000 | 400 | 600 |
| | | | | 4000 | 500 | 800 |
| | | | | 5000 | 700 | 1200 |
| | | | | 6000 | 800 | 1200 |

| CONDUITS | | | |
|---|---|---|---|
| 1/40% OF AREA | TRADE SIZE | 35% OF AREA | |
| 0.0989 | 6 | 10.106 | 28.875 |
| 0.1429 | 5 | 7.000 | 20.00 |
| 0.2245 | 4 | 4.454 | 12.725 |
| 0.2886 | 3 1/2 | 3.465 | 9.9 |
| 0.3874 | 3 | 2.581 | 7.375 |
| 0.5952 | 2 1/2 | 1.680 | 4.8 |
| 0.8529 | 2 | 1.173 | 3.35 |
| 1.3937 | 1 1/2 | 0.718 | 2.05 |
| 1.9048 | 1 1/4 | 0.525 | 1.5 |
| 3.3613 | 1 | 0.298 | 0.85 |
| 5.4422 | 3/4 | 0.184 | 0.525 |
| 9.5238 | 3/4 | 0.105 | 0.3 |

1410

METHOD AND APPARATUS FOR AUTOMATING ELECTRICAL ENGINEERING CALCULATIONS

RELATED APPLICATIONS

This patent application is related to and claims priority from U.S. Provisional Application No. 60/380,317, filed Oct. 25, 2001, the contents of which are incorporated herein by reference in their entirety.

GOVERNMENT SPONSORSHIP

This invention was not made with Government support.

COPYRIGHT NOTICE/PERMISSION

A portion of the disclosure of this patent document contains material that is subject to copyright protection. The copyright owner has no objection to the facsimile or electronic reproduction by anyone of the patent document or the patent disclosure as it appears in the Patent and Trademark Office patent file or records, but otherwise reserves all copyright rights whatsoever. The following notice applies to the software and data as described below and in the screenshots and drawing hereto: Copyright. 2001-2002 Electric Power Calc, Inc. All Rights Reserved.

BACKGROUND

Numerous software-based electrical power design systems are known for designing and simulating electrical power distribution network systems. In particular, software has been developed that models and assists with the design of large electrical power distribution facilities, i.e. facilities that distribute power on the power grids for regional areas of electrical power distribution. Such software may include simulation and design functions that assist in determining short circuit problems, load flows, transient stabilities, harmonics, arcing, power station management and other aspects of a large electrical power distribution system. Such software is typically data-intensive in that the user must have an intimate working knowledge and engineering expertise associated with the design and modeling of electrical power distribution systems to use the software. Operation of this software typically involves the user's entry of a significant body of data related to the intended system upon which the software assists in determining the system's design criteria. For example, design criteria for electrical power distribution network systems may include transformer sizes, transmission line wire sizes, transmission line phases and loads sizes, load flows, e.g. unbalanced load flows and voltage drop calculations, short circuit determinations, e.g. transient short circuit currents, interrupting duty calculations, and motor accelerations. Such detailed input is required to provide plots and graphical displays of power flows, and transient stability for the design and modeling of the electrical power distribution network system. Thus, due to the complex nature of large electrical power distribution network systems, the calculations performed by existing software are not typically automated. However, in certain aspects, the software may allow the designer to quickly identify problems and shortcomings of the intended electrical design based on the output from the software in combination with the electrical engineer's knowledge.

Other electrical system design software has been developed that provides a graphical means to lay out and model the performance of an electrical system. In particular, existing software provides assistance with the design of electrical systems within either power distribution environments associated with large electrical power plants or within buildings wherein the user will specify electrical requirement needs to be met and the software will provide related design criteria. Specifically, data related to the feeder circuits for a building or an electrical power plant may be provided to these software modules so that the engineer may manually determine the appropriate electrical characteristics of distribution panel boards (hereinafter all panel boards are referred to simply as "panels") complying with the design intentions of electrical building system. This software may include modeling features that enable the designer to graphically lay out the electrical panel board and its associated electrical loads according to standard electrical diagramming symbol formats, for example, for inclusion on a schematic. Such software may also provide libraries of components for use in the generation and creation of these electrical diagrams. From the electrical system schematics and layouts created with this software, electrical system modeling and analyses may be performed once all the required electrical system components and performance characteristics are determined and provided by the engineer. Such required data may include power flow and voltage drop calculations, fault analysis options, demand load analysis, feeder and transformer sizing calculations, motor starting calculations, and other high-level electrical design criteria. Thus these software modules are specifically programmed to address the schematic layout needs, the generation of reports and the analysis and resulting performance of new or existing, pre-designed, electrical power distribution systems.

Still other electrical design and analysis software provides a more fundamental modeling and reporting output regarding electrical power distribution systems within a building. This software provides layout, reporting and analysis of a lower-level electrical circuit design, for example at the electrical panel distribution level and building circuit level. Such software to date, however, has been limited in that it has not provided a designer of such power distribution centers with a bottom-up approach to the specification and design of such electrical power distribution systems.

Thus the need exists for electrical engineering design software that automates the design of an electrical power distribution system on a circuit-by-circuit, bottom-up basis, while also ensuring that the resulting system is in compliance with electrical codes. None of the existing software for electrical system design allow the users of such software to input individual circuit data from which information and design criteria related to those circuits is automatically created and upon which the higher level electrical power distribution system information may be automatically generated. For example, none of the existing software is capable of taking user-input branch circuit information and automatically creating distribution panel board information there from. Further, the software should have the capability to automatically recalculate all design information according to particular design criteria and/or electrical codes, particularly when the branch circuit information is modified dynamically. Finally, all the above calculations should involve information related to the design specification and selection of branch circuit components such as branch circuit panel board sizes, circuit breaker sizes and wiring specifications as well as and including distribution panel board information related thereto.

SUMMARY OF THE INVENTION

According to a preferred embodiment of the invention, a general-purpose computer-based system for designing an electrical power distribution system is provided having: a database having standards data associated with an electrical building standard; and a circuit design module for accepting power requirements for a plurality of branch circuits, each of the plurality of branch circuits having a set of branch circuit variables that defines a design for each of the branch circuits, the circuit design module determining branch circuit values for each of the branch circuit variables according to the standards data. According to further aspects of the invention, the power requirements include a load type, a kVA load, a voltage and a phase value for each of the branch circuits. In another aspect, the circuit design module automatically determines all of the branch circuit values. In still another aspect, the set of branch circuit variables includes at least one of each of: a branch circuit breaker size (TRIP), a branch circuit conductor size (AWG), a number of branch circuit conductors, a branch circuit ground conductor size (GND), a maximum branch circuit length (FT), and a branch circuit conduit size (IN). In further aspects of the invention, the electrical building standard is the National Electrical Code and the electrical building standard is the National Electrical Code and the standards data includes local variations to the National Electrical Code.

Another embodiment of the invention includes a panel design module that accepts the plurality of circuit designs from the circuit design module to determine a design of at least one panel, the panel having a set of panel variables that defines the design of the panel, the panel design module determining panel values for each of the panel variables according to the standards data. In variations of this aspect, the panel values are also determined according to the power requirements and the panel design module automatically calculates a connected load (kVA) based on the power requirements and determines a demand load for the panel design based on the standards data, the panel values being further determined by the demand load. In yet further refinements of this invention, the standards data used to determine the demand load is a load factor automatically determined by the panel design module from the electrical building standard; or the set of panel variables includes at least one of each of: a total panel capacity, a panel mains rating, a feeder conductor size, a number of feeder conductors, a maximum feeder length, a feeder ground conductor size, and a feeder conduit size. In still further aspects of the invention, the panel design module automatically determines all of the panel values and a set of user-specified panel variables is used in the design of the panel and the set of user-specified panel variables including at least one of: a panel voltage value, a panel mounting type, a panel interrupting ratings, an AIC rating, a number of phases, a temperature correction factor, a bus bar type, a TVSS device, a NEMA designation, an isolated ground, a neutral feeder conductor rating, and a number of poles.

In still another embodiment of the invention, the system includes a distribution panel design module that accepts the design of the panel from the panel design module to determine a design of at least one distribution panel, the distribution panel having a set of distribution panel variables that defines the design of the distribution panel, the distribution panel design module determining distribution panel values for each of the distribution panel variables according to the standards data. In additional aspects, the distribution panel values are also determined according to the power requirements and the distribution panel variables includes at least one of each of: a total distribution panel capacity, a distribution panel mains rating, a main feeder conductor size (AWG), a number of main feeder conductors, a maximum main feeder length, a main feeder ground conductor size, and a main feeder conduit size. In yet other aspects, the distribution panel design module automatically determines all of the distribution panel values or a set of user-specified distribution panel variables is used in the design the distribution panel, the set of user-specified distribution panel variables including at least one of: a distribution panel mounting type, a distribution panel interrupting ratings, an AIC rating, a number of phases, a temperature correction factor, a bus bar type, a TVSS device, a NEMA designation, an isolated ground, a neutral feeder conductor rating, a number of poles. In additional aspects the distribution panel design module automatically calculates a connected load based on the power requirements and determines a demand load for the distribution panel design based on the standard data, the distribution panel values for the distribution panel variables being further determined by the demand load. Still further, the standards data used to determine the demand load is a load factor automatically determined by the distribution panel design module from the electrical building standard. In a final aspect of this embodiment, a step-down transformer size for the load is automatically determined by the distribution panel module using the demand load.

According to another particularly preferred embodiment, the general-purpose computer-based system for designing an electrical power distribution system includes a database having standards data associated with an electrical building standard; a panel design module for accepting a phase and a voltage, the panel having a set of panel variables that defines the design of the panel; a circuit design module for accepting a kVA load, and a number of poles for each of a plurality of branch circuits, each branch circuit having a set of branch circuit variables that defines a design for the branch circuit; and wherein the circuit design module automatically determines branch circuit values for the branch circuit variables using the plurality of kVA loads, number of poles, and voltages, according to the standards data; and wherein and the panel design module automatically determines panel values for the panel variables using the plurality of branch circuit designs and the plurality of kVA loads, phases, and voltages, according to the standards data.

According to particularly preferred aspects of this embodiment, the electrical building standard is the National Electrical Code; and the set of branch circuit variables includes at least one of: a branch circuit breaker size, a branch circuit conductor size, a number of branch circuit conductors, a branch circuit ground conductor size, a maximum branch circuit length, and a branch circuit conduit size, and the set of panel variables includes at least one of: a total panel capacity, a panel mains rating, a feeder conductor size, a number of feeder conductors, a maximum feeder length, a feeder ground conductor size, and a feeder conduit size. In still further aspects, the panel design module automatically calculates a connected load based on the power requirements and determines a demand load for the panel design based on the plurality of kVA loads, the panel values being further determined by the demand load.

According to a particularly preferred method of the invention, a general-purpose computer-implemented method for designing an electrical power distribution system, includes the steps of defining a set of branch circuit variables that specify a branch circuit design according to an electrical building standard; and repetitively, inputting power requirements for a branch circuit; calculating branch circuit values for each of the branch circuit variables; comparing the calculated branch circuit values to a database of standard branch circuit data values associated with the electrical building standard; selecting automatically one of the standard branch circuit data values for each of the branch circuit values; and outputting the set of selected branch circuit values so as to specify the branch circuit design.

In further aspects of the preferred method, the branch circuit variables include: a branch circuit breaker size, a branch circuit conductor size, a number of branch circuit conductors, a branch circuit ground conductor size, a maximum branch circuit length, and a branch circuit conduit size; or the step of inputting power requirements includes inputting a kVA load, a voltage and a phase value for the branch circuit. In other refinements of the method, all of the repetitively performed steps are performed on a single branch circuit. In addition, the method may include displaying analysis notes, the analysis notes including at least one of an error message, a warning message, or a design suggestion associated with the branch circuit design or overriding one of the selected branch circuit values to specify the branch circuit design.

In another particularly preferred embodiment, the method includes defining a set of panel variables that specify a panel design according to an electrical building standard; determining a connected load from the input power requirement for the branch circuits; calculating panel values for each panel variable; comparing the calculated panel values to a database of standard panel data values associated with the electrical building standard; selecting automatically one of the standard panel data values for each of the panel values; and outputting the set of selected panel values so as to specify the panel design. In particular aspects of this embodiment the panel variables include: a total panel capacity, a panel mains rating, a feeder conductor size, a number of feeder conductors, a maximum feeder length, a feeder ground conductor size, and a feeder conduit size. In other aspects, all of the steps for specifying the panel design are performed concurrently with the steps for specifying the branch circuit designs; or all of the steps are repeated to so as to specify a plurality of panel designs. In still other variations, the method includes displaying analysis notes, the analysis notes including at least one of an error message, a warning message, or a design suggestion associated with the panel design, or overriding one of the selected panel values to specify the panel design, or wherein the step of calculating the panel values further includes determining a load factor or each of the branch circuits; and wherein the step of calculating the panel values includes using the load factor to calculate the panel values.

In still another particularly preferred embodiment, a general-purpose computer-implemented method for designing an electrical power distribution system, includes the steps of defining a set of branch circuit variables that specify a branch circuit design according to an electrical building standard; defining a set of panel variables that specify a panel design according to an electrical building standard; inputting power requirements for a branch circuit; determining a connected load from the input power requirement for the branch circuits; calculating branch circuit values and panel values for each of the branch circuit variables and panel variables respectively; comparing the calculated branch circuit values and panel values to a database of standard branch circuit data values and standard panel data values associated with the electrical building standard; selecting automatically one of the standard branch circuit data values for each of the branch circuit values and one of the standard panel data values for each of the panel values; and outputting the set of selected branch circuit standard values and the selected standard panel values so as to specify the branch circuit design and the panel design respectively.

In further aspects of the above recited method, all of the steps are repetitively performed to design the electrical power distribution system, or the method further includes inputting updated power requirements and wherein all of the steps are repetitively performed so as to output updated selected branch circuit values and updated selected panel values that specify the circuit designs and the panel design respectively. In still further aspects, the method includes generating an inventory of electrical components for the electrical power distribution system based on the selected branch circuit values and the selected panel values, or generating a cost estimate for the inventory from a pricing database associated with an inventory supplier. In some final aspects, the method may include reevaluating the power requirements within an optimization module, and repetitively performing all of the steps to optimize the selected branch circuit values and the selected panel values based with respect to the cost estimate; or generating a report of electrical components for the electrical power distribution system based on the selected branch circuit values and the selected panel values; or importing the report into an electrical component layout program.

In another particularly preferred embodiment, a computer-readable media for storing instructions for designing an electrical power distribution system, includes instructions for defining a set of branch circuit variables that specify a branch circuit design according to an electrical building standard; and repetitively: inputting power requirements for a branch circuit; calculating branch circuit values for each of the branch circuit variables; comparing the calculated branch circuit values to a database of standard branch circuit data values associated with the electrical building standard; selecting automatically one of the standard branch circuit data values for each of the branch circuit values; and outputting the set of selected branch circuit values so as to specify the branch circuit design.

In various aspects, the above method includes instructions for: defining a set of panel variables that specify a panel design according to an electrical building standard; determining a connected load from the input power requirement for the branch circuits; calculating panel values for each panel variable; comparing the calculated panel values to a database of standard panel data values associated with the electrical building standard; selecting automatically one of the standard panel data values for each of the panel values; and outputting the set of selected panel values so as to specify the panel design.

In further embodiments of the invention, a computer-readable media is provided for storing instructions for designing an electrical power distribution system, including instructions for: defining a set of branch circuit variables that specify a branch circuit design according to an electrical building standard; defining a set of panel variables that specify a panel design according to an electrical building standard; inputting power requirements for a branch circuit; determining a connected load from the input power requirement for the branch circuits; calculating branch circuit values and panel values for each of the branch circuit variables and panel variables respectively; comparing the calculated branch circuit values and panel values to a database of standard branch circuit data values and standard panel data values associated with the electrical building standard; selecting automatically one of the standard branch circuit data values for each of the branch circuit values and one of the standard panel data values for each of the panel values; and outputting the set of selected branch circuit standard values and the selected standard panel values so as to specify the branch circuit design and the panel design respectively.

In a final embodiment of the invention, a method of placing an order for an inventory of electrical building components with an inventory supplier is provided and includes: generating an inventory of electrical components for an electrical power distribution system based on a set of branch circuit values and a set of panel values, the branch circuit values and the panel values specifying a branch circuit design and a panel design respectively, the branch circuit values and the panel values selected according to an electrical building standard; generating a cost estimate for the inventory from a pricing database associated with the inventory supplier; and transmitting the inventory of electrical components to the inventory supplier for purchase. In particular aspects of this embodiment, the step of transmitting includes the step of transmitting a facsimile of the inventory to the inventory supplier over a telephone line; or the step of transmitting includes the step of transmitting the inventory to the inventory supplier in digital format over a web-based interface.

BRIEF DESCRIPTION OF THE DRAWINGS

FIG. 5 shows a subset of the data within the database of the software system according to one embodiment of the present invention.

FIG. 6 is another screen shot of another branch circuit panel board module according to one embodiment of the present invention.

FIG. 8 is a screen shot of a building equipment module according to one embodiment of the present invention.

FIG. 9 is another screen shot of another building equipment module according to one embodiment of the present invention.

FIGS. 11-15 show various other subsets of the data within the database of the software system according to one embodiment of the present invention.

DETAILED DESCRIPTION OF THE INVENTION

The present invention is a computer software package that is capable of automating the design and specification of electrical power distribution systems within one or more buildings or other structures. The method and apparatus of the present invention may be embodied in numerous software formats such as a Microsoft Excel spreadsheet or other data calculation tools, although persons of skill in the art would recognize the interchangeability of different coding methods by which to achieve the objects of this invention. Further, the software of the present invention may be coded in software in a number of different formats, including, for example, the spreadsheet described as the preferred embodiment herein, or as coded software modules programmed in C or HTML, for example. In one particular embodiment, an Excel spreadsheet is used to automate the electrical circuit calculations that determine the resultant electrical equipment within a building such that any changes to the lower-level electrical circuit specifications force a recalculation of all electrical specifications, including possibly a re-specification of necessary electrical equipment. The resultant changes are then automatically distributed throughout the remainder of the design of the electrical building characteristics and are reflected by changes in the overall electrical system design. One exemplary software package embodying the present invention is sold under the name Power Calc PaK by Electric PowerCalc, Inc. of Delray Beach, Fla.

Figure 1:
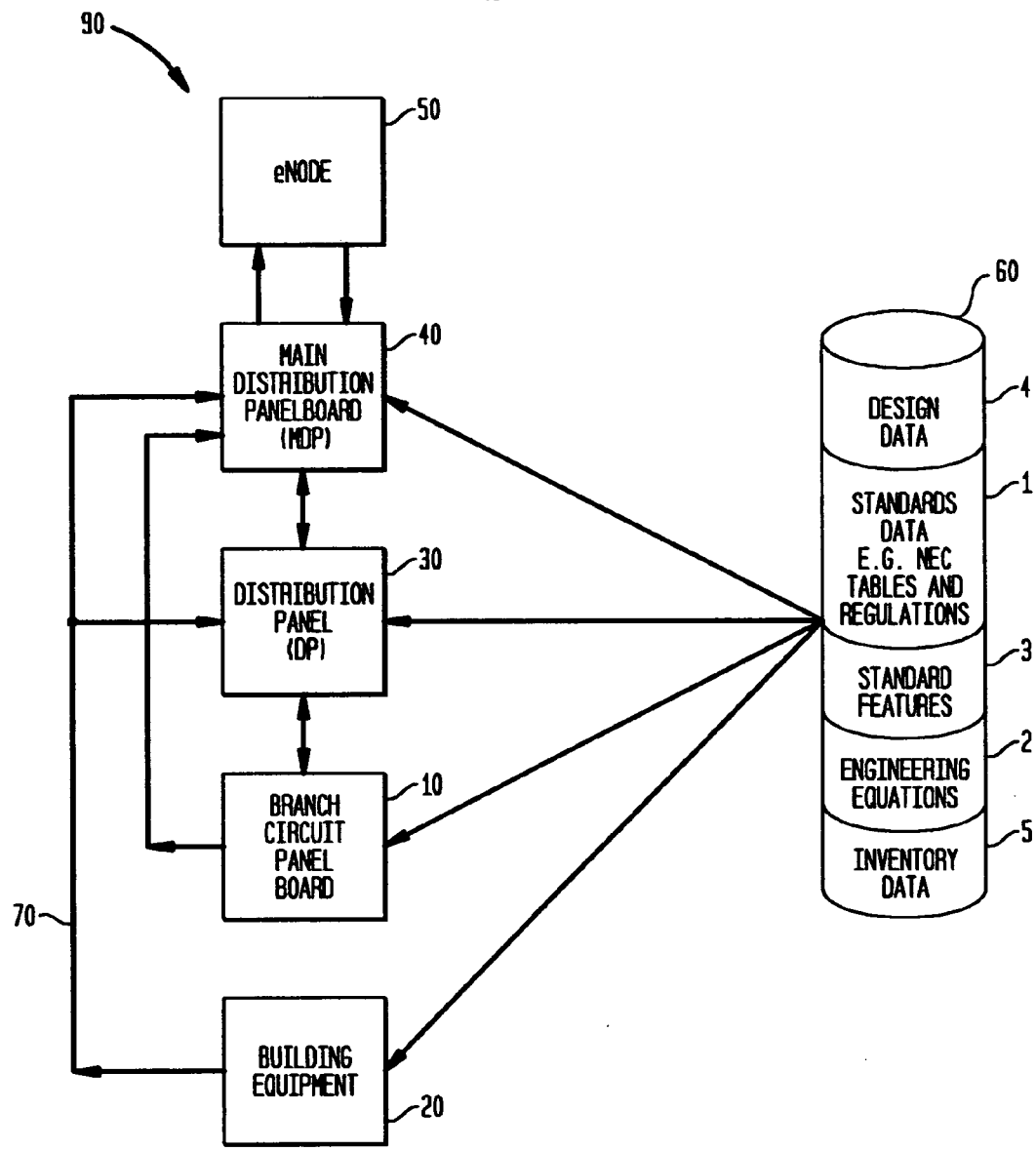
FIG. 1 is an overall block diagram of the software modules and database(s) according to one embodiment of the present invention.

Referring to FIG. 1, the electrical power distribution system design software 90 of the present invention includes a branch circuit panel board module 10, a building equipment module 20, a distribution panel module 30 and a main distribution panel 40. In one particularly preferred embodiment, each of these modules is displayed on separate spreadsheets within the program. With this functional arrangement, data input may be provided within a software module dedicated to the specification of one portion of an electrical circuit, the branch circuit panel board module 10 for example, and resultant changes calculated by that module may be passed to the other design modules for reinterpretation and re-specification of the overall electrical design. Also included within the software of the present invention are an overall project module, eNODE 50, in which the user may enter overall project data related to the design of the electrical power distribution system. Finally, the software system of FIG. 1 includes an extensive database 60 of electrical engineering design information that is supplied to the software modules for making calculations and specifying electrical components. Database 60 may include, among other things, engineering equations 2 and design data 4 related to the design of the electrical power distribution system, tables of electrical standards data 1, e.g. the National Electrical Code (NEC) standards data, and certain standard features 3 of the components of the electrical power distribution system, e.g. circuit panel board mounting type. Database 60 may also optionally include an inventory 5 of electrical components that may used to specify particular electrical parts and components to be used in the design of the electrical power distribution system.

In operation, data is entered by the user into each of the software modules such that a minimum set of electrical requirements needed to specify and define the electrical characteristics and elements of each module are provided by the user. This user-entered data is combined with and relies upon the engineering equations, design data and standards data contained within database 60 to calculate the remaining electrical power distribution system variables so as to fully specify a complete system. In this fashion, the design of the electrical power distribution system is specified in a bottom-up fashion. For example, users may first enter data into the branch circuit panel board module 10. From that data, related information is pulled from database 60, such as NEC data and engineering equations related to the specification of particulars operation of the branch circuit panel board. Then, the user-entered data and resultant, calculated data is automatically fed from the branch circuit panel board module 10 to the distribution panel board module 30. Thus, in an automated, sequential fashion, each of the software modules of the software of the present invention are functionally interconnected and interrelated so as to provide an "upward" data flow in specifying the design of the system. Likewise, as higher-level modules are defined by the data entered into lower level modules, certain design characteristics and criteria may also be fed back down to the lower level modules in further specifying the design of the electrical power distribution system. For example, data entered into the branch circuit panel board module 10 may be calculated within that module, fed up to the distribution panel module 30, at which point, additional calculations may be generated using the standards data and the equations within database 60, and from which, supplemental data may be transferred back to the branch circuit panel board module 10 from the distribution panel module 30 as shown by path 70. In this fashion, data flows throughout the software of the present invention so that user-specified input data at the lower level design modules, such as the building equipment module 20 and branch circuit panel board module 10, are transmitted and bubbled upwards while corresponding data is transmitted and bubbled downward so as to define and completely specify an electrical power distribution system for a building.

Figure 2:
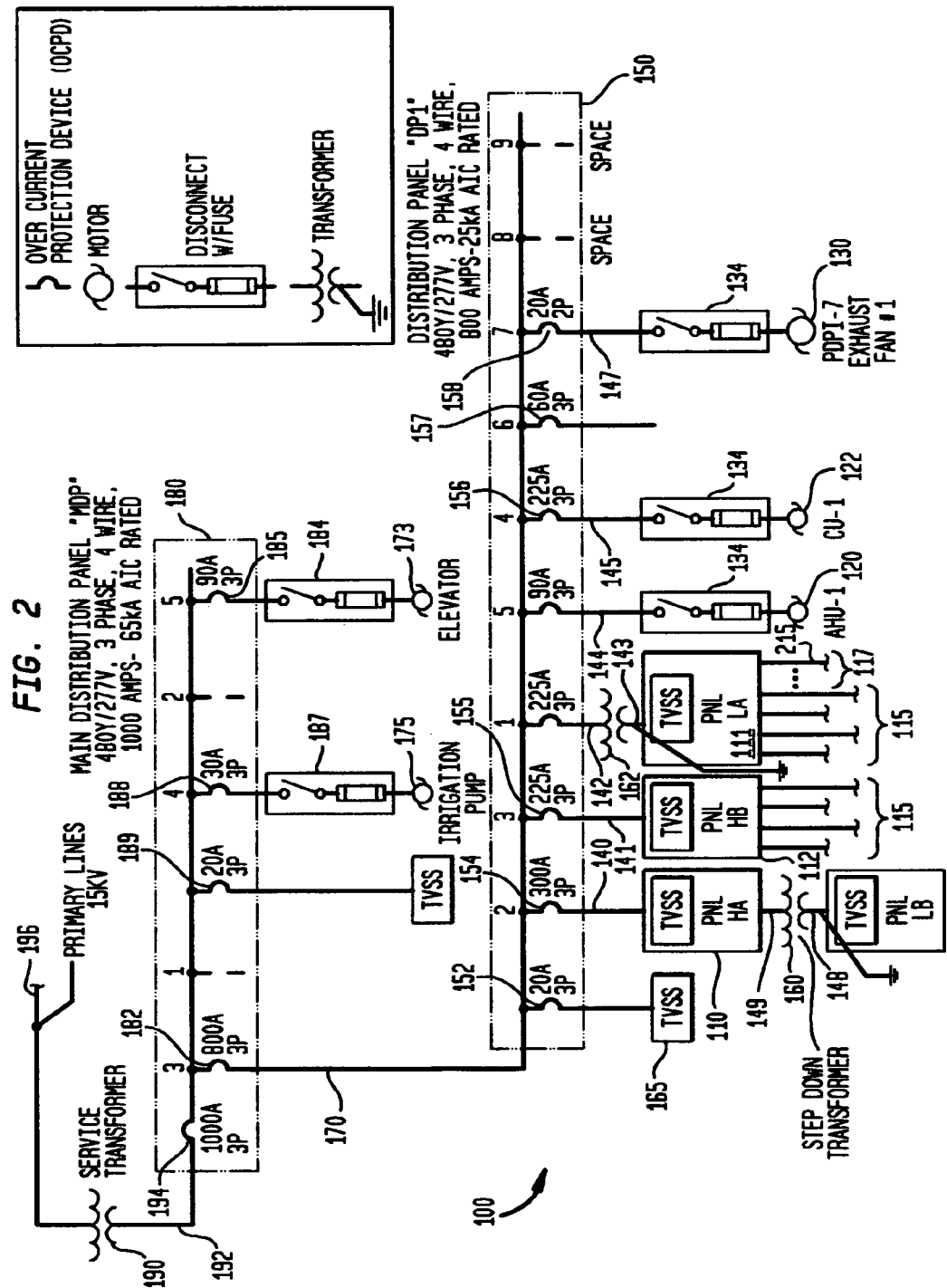
FIG. 2 is a power one line diagram of an electrical power distribution system according to one embodiment of the present invention.

Referring to FIG. 2, the electrical power distribution system 100 that is automatically designed by the software of the present invention is shown. A plurality of branch circuit panels 110-112 are provided as shown in FIG. 2. These branch circuit panels boards may be the type located within a building's internal electrical closets, e.g. along walls, within a house garage, or within an electrical room in a commercial building. Branch circuit panel boards 110-112 provide power to individual branch circuits 115 to which they are coupled. Branch circuits 115 may consist of individual, end-use circuits, for example wall outlets within a building, as well as other varied electrical consumption circuits, e.g. lighting, dryers, and small air conditioners. Also shown on FIG. 2, larger electrical equipment, building equipment 120 and 130, and 173 and 175 is also provided for within the electrical power distribution system of the building. Building equipment 120 may include, for example, a large, air handling unit 120 and exhaust fan 130 supplied by the distribution panel board 150 and condenser unit 122 supplied by distribution panel board 150 (not shown in FIG. 3). The building equipment is typically fed through local circuit protection devices 134 which provide an electrical disconnect feature for the building equipment under electrical failure conditions.

Downstream electrical equipment and circuits, such as branch circuit panel board 110 and building equipment 120 through 130 are then fed to distribution panel board 150 via a plurality of feeder circuits 140-147. Distribution panel board 150 provides power to the branch panels and building equipment from the main distribution panel boards 180 (if provided or needed) further up the electrical power distribution system within the building. Distribution panel board 150 may also include feeder circuit protection 152-158 for each feeder circuit 140, for example, with the overcurrent protection devices (circuit breakers) within distribution panel board 150. Distribution panel board circuit breakers 152 through 158 may include various types of circuit breakers specifically tailored to the needs of the coupled branch circuit. For example, circuit breaker 155 shown in FIG. 2 is a 225 Amp, 3-pole circuit breaker provided as the overcurrent protection device for associated branch circuit panel board 112 along feeder 141. Likewise, circuit breaker 158 is a 20 Amp, 2-pole overcurrent protection breaker associated with building equipment 130 fed through feeder 147. In a similar fashion, each of feeder circuits 140 may be provided with certain electrical overcurrent protection elements within electrical distribution panel board 150.

In operation, distribution panel board 150 provides a 480-volt feed capacity to the plurality of downstream branch circuit panel boards 110-112 and building equipment 120-130. Often, downstream branch circuit panel board circuits and electrical building equipment operate at voltages lower than those provided by the distribution panel board. In such instances, step down transformers 160, 162 may be used within the feeder circuits 142/143 or sub-feeder circuits 148/149 to step down the voltage so as to accommodate the lower voltage. For example, branch feeder circuit 142 is shown as distributing power from distribution panel board 150 at 480 volts, which is stepped down to a 208-volt feeder 143 by step down transformer 162 to supply branch panel board 111 with the required voltage.

Also optionally included within distribution panel board 150 is transient voltage surge suppression system device 165. Transient voltage surge suppression system device 165 monitors and regulates the voltage levels within the distribution panel board 150 so as to suppress and control voltage spikes that are introduced within that portion of the electrical power distribution system by virtue of the operation of the branch circuits and building equipment. Likewise, transient voltage surge suppression system device 165 monitors the voltage arriving from up-stream electrical feeder circuits 170 so as to suppress downstream traveling voltage transients and insure the proper operation of distribution panel board 150.

At one of the highest levels of the electrical power distribution system upon which the software of the present invention operates is main distribution panel board 180. Typically, main distribution panel 180 provides voltage and current to a plurality of distribution panel boards 150 through feeder circuit 170. Similar to distribution panel board 150, main distribution panel board 180 may also include downstream electrical devices such as building equipment and other distribution panel boards for which the main distribution panel board supplies electrical power. For example, large building equipment such as an irrigation pump 175 or an elevator 173 may be connected through local circuit protection 187 and 184 respectively to main distribution panel board 180. Again, as with distribution panel 150, main distribution panel board 180 may contain overcurrent protection devices, or circuit breakers, that protect against electrical failures within the feeder circuit, the connections to the feeder circuit and the building equipment itself. Circuit breakers 182, 185, 188, 189, shown in FIG. 2, are examples of such circuit breakers. Main distribution panel board 180 is provided with electrical power from upstream service transformer 190 via feeder circuit 192 and through overcurrent protection device 194.

The electrical power distribution system within a building, as shown in FIG. 2, is typically provided power from the outside by a commercial power company. This commercial-grade power is delivered by primary feeder 196. Primary feeder 196 provides electrical power through service transformer 190 to main distribution panel board 180 within the building. In operation, the commercial power company provides electrical power at a significantly higher voltage than is required for the operation of branch circuits 115 within a building. For example, the outside power company may provide a 15-kV power feed which is stepped down by service transformer 190 to a 480 Volt feed to main distribution panel board 180. From main distribution panel board 180, the electrical power is further distributed to distribution panel board 150 through feeder circuits 170. From distribution panels board 150, individual branch circuit panels 110-112 and building equipment 120-130 may be fed either directly with 480 Volts or indirectly by further stepping down the voltage to 208 volts or 120 volts, for example through step down transformers 160 and 162. Step down transformers may be used in this way throughout the electrical power distribution system of FIG. 2 so as to provide the required voltage at any point in the system. The power distribution system of FIG. 2 is, in general, well known and typical of the electrical power distribution systems found within buildings.

Figure 3:
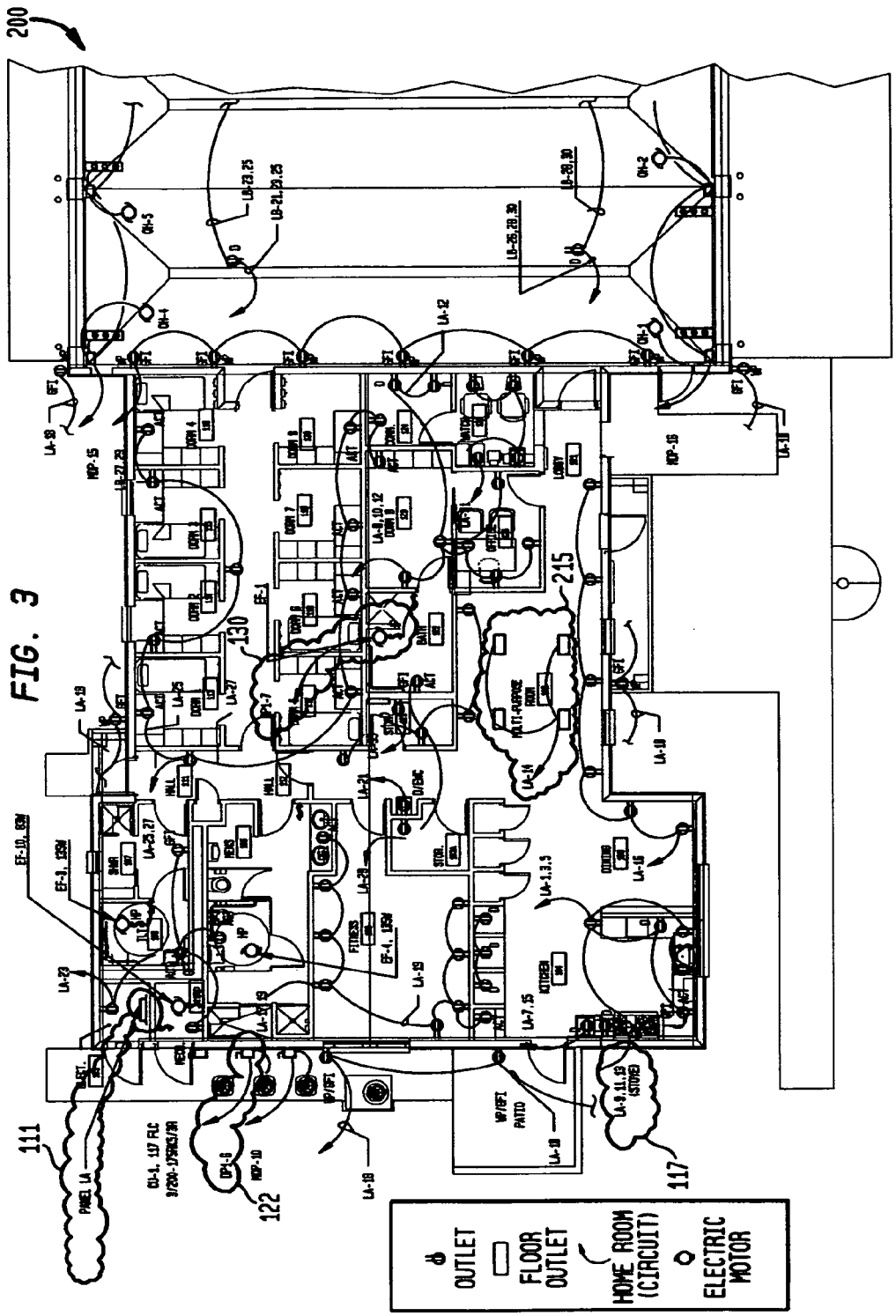
FIG. 3 is a partial power plan for one physical portion of a building served with electrical power from the electrical power distribution system provided in FIG. 2.

FIG. 3 provides the internal, electrical layout schematics of a building that is provided electrical power by the electrical power distribution system shown in FIG. 2. Within building 200 are numerous branch circuits and building equipment for which electrical power is needed. In particular, branch circuit panel board 111 is shown with an electrical closet in the top left portion of building 200. Branch circuit panel board 111 is the same as that shown on FIG. 2. As an example, branch circuit panel board 111 feeds electrical power to stove 117, also shown on the left side of building 200 and referred to in FIG. 2. Among the plurality of branch circuits fed by branch circuit panel board 111 are various electrical circuits within building 200. For example, these branch circuits may supply power through electrical outlets on the walls, on the building floor, within kitchen and dorm areas, and for any other electrical needs within the building. One particular branch circuit 215, FIGS. 2 and 3, serves electrical outlets on the floor of a multi-purpose room and are supplied electrical power by branch circuit panel board 111.

From a circuit design perspective, each of the branch circuits within building 200 of FIG. 3 includes a subset of specific and necessary design information related to that branch circuit. According to the software of the present invention, the electrical engineer/system designer begins the overall design of the electrical power distribution system of FIG. 2 by supplying this minimum subset of information for each of the branch circuits to be designed, thus beginning the design of overall electrical power distribution system at the "lowest level" branch circuits shown in FIG. 3. As each of the individual branch circuits' parameters are specified, the software of the present invention calculates and defines the electrical system requirements and specifies the electrical components required to hierarchically construct the associated branch circuit panel boards, distribution panel boards and main distribution panel boards. This is achieved by providing either or both of the user-specified values and subsequently calculated electrical characteristics from one level of the electrical power distribution system to the next for use in calculating its own variables. In this fashion, a bottom-up approach to the electrical design of the system is achieved by the software of the present invention. In one particularly advantageous aspect of the invention, individual changes made by the electrical engineer within a particular branch circuit cause the software to automatically re-calculate the variables needed by the upstream portions of the electrical power distribution system including changes to the branch circuit characteristics, the branch circuit panel boards and other upstream electrical distribution equipment. In a likewise fashion, the specification by the electrical designer of branch circuit panel boards 110, 111 and 112 may also be modified in a real-time basis, and the software of the present invention automatically re-calculates the electrical design parameters necessary to specify and define the upstream distribution panel and main distribution panel boards. Furthermore, the addition of electrical equipment after the "finalization" of a design does not necessitate an entire re-calculation of the loads and tolerances of the overall electrical distribution system. For example, adding a piece of building equipment will automatically cause the software of the present invention to re-calculate and modify as necessary the design and specifications of the electrical power distribution system and will likewise automatically flag errors that may result from the addition of such equipment.

Central to the operation of the software of present invention is the specification and definition of the load types for each of the branch circuits that are supplied by electrical power by the branch circuit panel board. By defining and associating a particular load type with each physical branch circuit, the software of the present invention defines an associated set of branch circuit variables that completely specify the electrical design of that particular branch circuit. For example, as shown in FIG. 3, branch circuit 215 consists of four, floor-based, electrical receptacles that are connected to branch circuit panel board 111 within building 200. For this particular receptacle cluster, the following branch circuit variables are needed to define that branch circuit: overcurrent circuit protection device size (i.e. circuit breaker size), conductor size, conduit size, ground conductor size, and voltage drop. Certain branch circuit variables are calculated automatically by the software of the present invention according to the load input for a particular branch circuit. For example, with respect to the branch circuit 215 of FIG. 3, the software of the present invention, following the user input of the maximum possible potential loads for the four electrical outlets, will calculate a maximum, permissible voltage drop for that branch circuit based on the engineering equations 2 and the design data 4 portions of database 60 (FIG. 1). From the total load calculated for that branch circuit and the permissible voltage drop, the software within the branch circuit panel board module will consult database 60 (FIG. 1) and select appropriately specified physical components for constructing the electrical power distribution system according to building standards data 1 within database 60. In particular and with respect to the four floor-based electrical outlets of branch circuit 215, the design data 4 portion of the database 60 is consulted to provide a maximum permissible voltage drop for the load type specified by the user (selected from a group provided by the software). The engineering equations 2 of database 60 are then used to calculate currents based on the user input information regarding the total load of the four outlets. This results in a calculation of the following branch circuit variables: a permissible length of a conductor or wire of particular size that may be used to electrically connect the four outlets, the actual ground conductor size used within that electrical circuit, the conduit size used to house the conductors and ground conductor, and the size of the overcurrent protection device (e.g. circuit breaker) needed within branch circuit panel board 111 to support that branch circuit load. In this fashion, the electrical circuit designer need only input end-use electrical requirements for a particular room, such as the number of electrical outlets, the specification of the building equipment, and other such load types, from which the software will automatically calculate the physical components needed to produce that circuit according to and in compliance with particular building codes, such as the NEC.

The physical presentation of the software according to the present invention will now be described with respect to FIGS. 4 through 10 which illustrate one particular embodiment of the present invention.

Figure 4A:
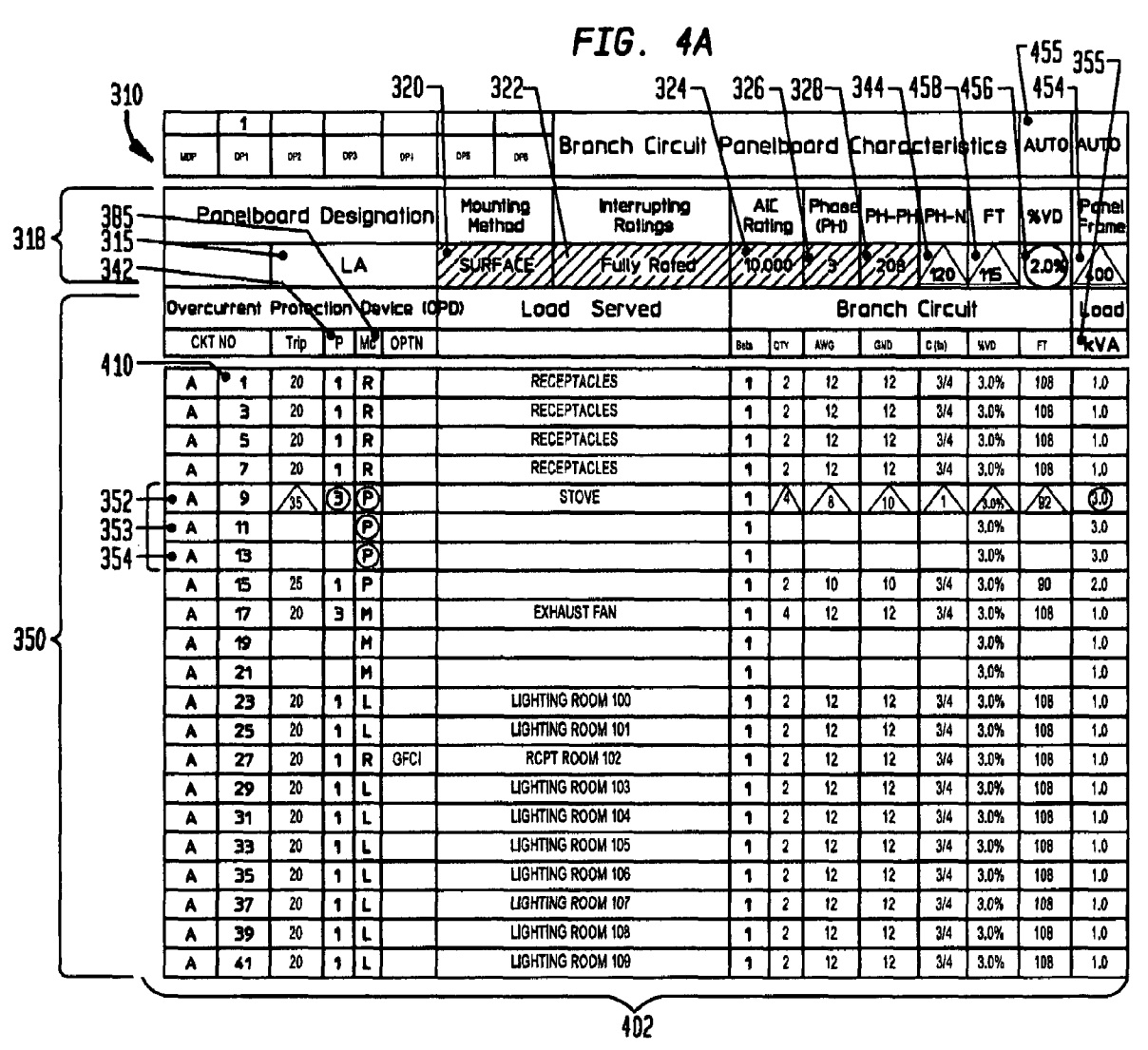
Figure 4C:
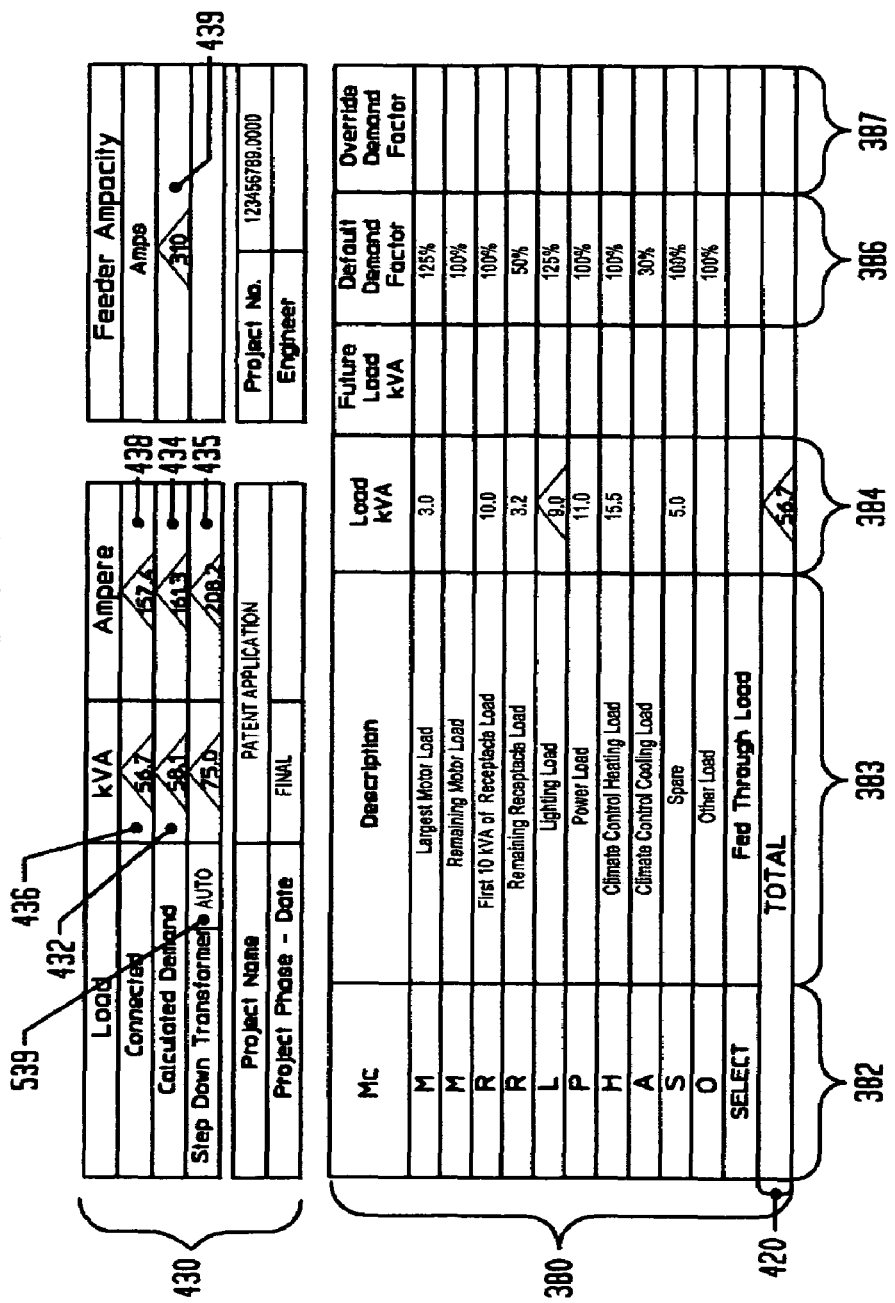
FIG. 4 is a screen shot of the branch circuit panel board module according to one embodiment of the present invention.

Referring to FIG. 4, an exemplary spreadsheet 310 illustrating one embodiment of the branch circuit panel board module 10 (FIG. 1) is shown. From a user-operability standpoint, the spreadsheet of FIG. 4 operates as any other spreadsheet in that it is programmed to either directly accept a user's data input within to each of the required fields or is programmed to provide a drop-down box from which the user selects a particular value from one of the preprogrammed, pre-specified values. Equations and databases within the spreadsheet are also programmed and provided as part of the module so that other output cells in the spreadsheet automatically provide results based on the user input provided above.

In the example of FIG. 4, the branch circuit panel board spreadsheet embodies the characteristic electrical information for branch circuit panel board 111, identified as PNL LA in FIG. 2 and branch circuit panel label LA within panel board designation field 315. In operation, the user of the software activates the software to create an individual spreadsheet similar to that shown in FIG. 4 for the design of each of the branch circuit panel boards 110-112 within the electrical power distribution system. Certain fields within the branch circuit panel board module are populated by the user in advance of the specifying individual branch circuits so as to provide overall characteristics of the branch circuit panel board. These fields are indicated by the single line shaded areas within FIG. 4. Subsequently, individual branch circuit data are provided by the user so as to specify electrical characteristics of each of the individual branch circuit panel board circuits that comprise that branch circuit panel board. These fields are indicated by the circled cell values within FIG. 4. The operation of the spreadsheet with respect to the specification of overall panel characteristics will be discussed first.

Figure 5:
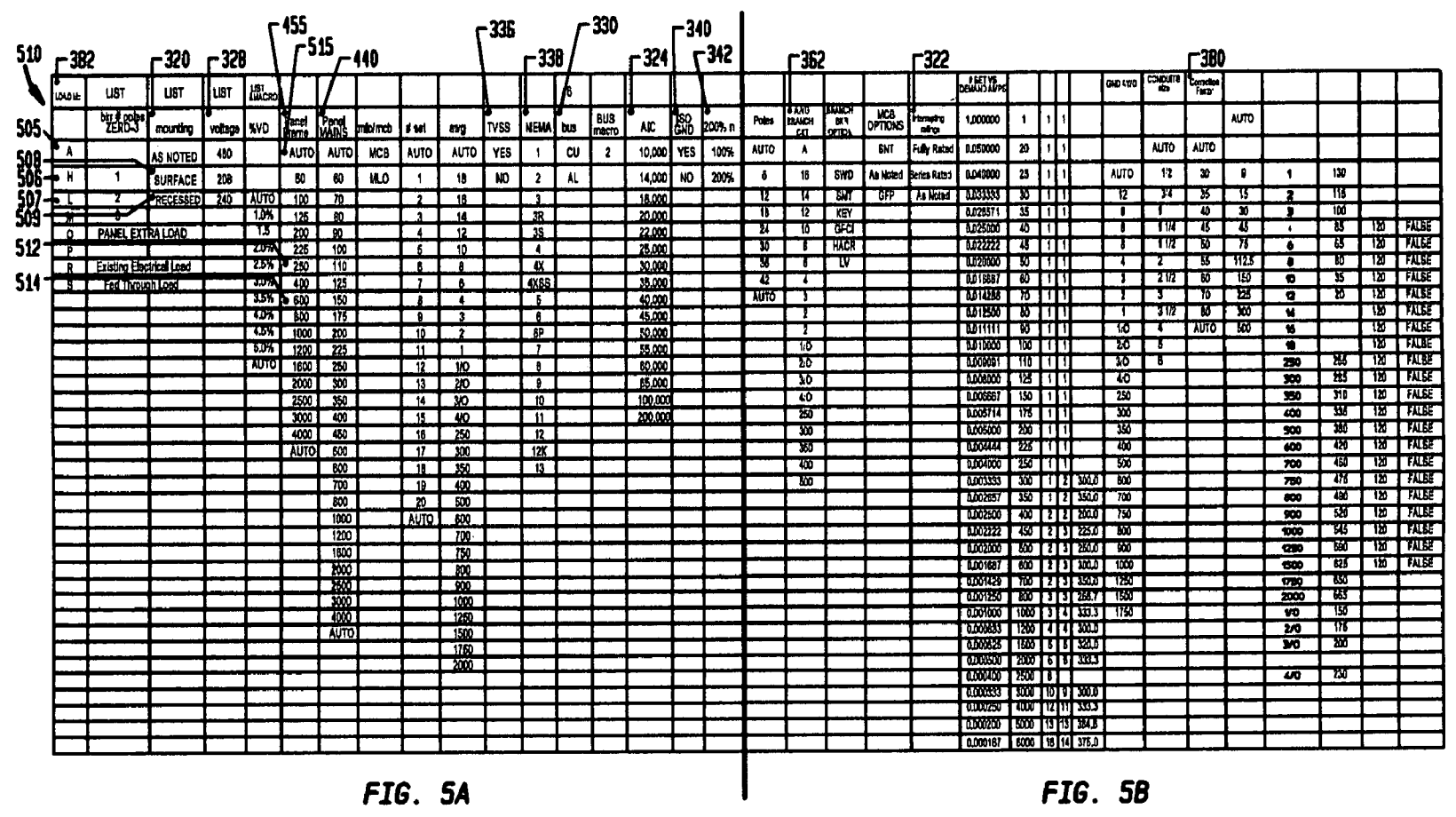

In order to begin the specification of a particular branch circuit panel board, the user must first specify certain overall panel board information, or standard features, within spreadsheet header region 318. In particular, the value for the panel board field 315, shown as panel board LA in FIG. 4, is provided by the user. Subsequently, the user specifies a panel board mounting method 320, an interrupting ratings 322, an amperage interrupting capacity (AIC) rating 324, a branch circuit panel board phase 326, a phase-to-phase voltage 328, a mains rating type 332, a temperature correction factor 334, and a bus bar type 330. In addition, the user may also specify the presence of a transient voltage surge suppression system device 336, National Electric Manufacture Association designation (NEMA) 338, the presence of an isolated ground 340 and a neutral conductor rating 342. FIG. 5 illustrates one embodiment of this standard features data 3 within database 60. The data provided in FIG. 5 show exemplary values for each of the above-mentioned user-selected input data which may be programmed in the branch circuit panel board module as selectable, drop-down boxes within each one of the cells shown in the spreadsheet of FIG. 4. Following these initial user selections, other fields within header region 318 are automatically populated by the spreadsheet according to engineering equations 2 and design data 4 in combination with the previously described, user-specified input. Specifically, phase-to-neutral calculation 344 is made based upon the phase-to-phase voltage selected at 328. Still other information within header region 318 is calculated automatically by the spreadsheet, but these values are dependent upon the information entered by the user within spreadsheet center portion 350.

Prior to the entry of branch circuit information, the different branch circuit load types must be defined by the software of the present invention. Central to the specification of each branch circuit, the spreadsheet of FIG. 4 provides the user with pre-defined load types as shown in spreadsheet analysis section 380. Each of the individual load types is identified by a single-letter designation in the macro field (MC) column 385 for which a description of the load type is provided in the description column 383. Analysis section 380 also provides additional load-related fields such as the load kVA 384, a default-demand factor, 386, the demand kVA 388 and analysis notes section 390. Several of the additional fields in the analysis section 380 are automatically populated with calculated values dependent upon spreadsheet data input by the user into center portion 350. Other portions of the analysis section are pre-defined by the spreadsheet according to electrical standards data. For example, the default demand factor 386 is predefined, although this data may be overridden by the user in their specification to override the demand factor as shown in field 387. Further, a section is provided within analysis section 380 for engineer analysis notes as shown in 390 which is automatically populated by the spreadsheet of FIG. 4 depending on the loads used within the specification of the branch circuit panel board. The details of these populated fields will follow a discussion of the center portion of spreadsheet 350.

As provided in FIG. 4, center region 350 of branch circuit panel board spreadsheet 310 is divided up and presented according to the actual physical layout of a branch circuit panel board used within the electrical power distribution system. In particular, the center region 350 of the spreadsheet of FIG. 4 is divided into three circuit panel board sections 400-404. Center section 400 graphically represents the three bus bars used for power distribution within the branch circuit panel board. In the particular branch circuit panel board of FIG. 4 shows a three-phase panel board with three different buses each carrying a different phase (A, B, and C) of the three-phase branch circuit. The center region 350 of the branch circuit panel board spreadsheet is further divided into two column groups, a right column group 404 and a left column group 402, with each row in the column groups graphically representing the actual circuit breaker connections to the load circuits within the branch circuit panel board. Left branch circuit panel board column group 402 identifies the odd number circuit breaker positions within the branch circuit panel board as identified by the circuit number identifiers shown in circuit number field 410. Similarly, the right branch circuit panel board column group 404 identifies the even numbered circuit breaker positions within the branch circuit panel board as identified by circuit number field 414. Thus, each line entry within center section 350 indicates an individual connection of a circuit breaker to one bus from the three phases within the central portion 400 of the branch circuit panel board. For example, branch circuit 1 in the left branch circuit panel board column group 402 enables a circuit breaker connection only to phase A of the center, three-pole bus structure. Likewise, branch circuits 3 and 5 in the left branch circuit panel board column group 402 only permit a circuit breaker to be connected to phases B and C respectively of center bus, three-pole bus structure. The branch circuits within right column group 404 of the branch circuit panel board function similarly. In this fashion, the layout of the spreadsheet mimics the actual, physical layout of the branch circuit panel board, thereby making it easier for installation personnel to correctly identify the proper circuit breakers and loads associated with a particular circuit breaker panel without the need for additional wiring diagrams or schematics that provide the same information as that contained on the branch panel spreadsheet.

Referring to center region 350 of the branch circuit panel board spreadsheet, the software user/electrical system designer specifies the characteristics of the desired branch circuits, by providing key data within the fields of center section 350. By way of reference, certain user input data within branch circuit panel board spreadsheet 310 is indicated by circled values within the spreadsheet cells. Other, calculated values are similarly represented by values with triangles around them within the spreadsheet cells. In particular each branch circuit design may be completed by entering data within a single data line entry area, e.g. 351, to define that particular branch circuit within that associated branch circuit panel board. As shown at entry 351, corresponding to branch circuit 215 (LA-14) of FIG. 3, the designer defines branch circuit 215 by adding the power requirements or kVA of electrical loads within that circuit and inputs that sum in corresponding kVA field 354. In addition, the user specifies the load macro type for the circuit. The load macro type is defined as one of a pre-determined set of loads provided in macro field (MC) column 382 of the analysis section 380. In the example of branch circuit 215 of FIG. 3, the system designer selects macro type R for receptacle load and inputs that value into field 356 of line 351. In addition, the system designer specifies the number of electrical poles within the branch circuit as shown in the P field 358 of branch circuit entry 351. Once the necessary, user-defined fields are input, e.g. total kVA, load type, and the number of poles, the software of the present invention refers to the standards data 1, engineering equations 2 and the design data 4 within database(s) 60 to automatically calculate and determine the physical characteristics of the electrical equipment needed to fully specify and construct branch circuit 215 of FIG. 3.

As shown in FIG. 4, several output values are provided by the software of the present invention based on the above-mentioned inputs for branch circuit entry 351. The first calculated value is the circuit breaker trip value, shown in field 360 of branch circuit 351. In the example of branch circuit 351, the single pole, floor receptacle circuit having a 1.2 kVA load is determined to have a circuit breaker trip value of 20 Amps. Further, the spreadsheet automatically calculates and determines the following circuit characteristics using the engineering equations 2, standards data 1 and design data 4 within database 60: the wiring conductor size of #12 (AWG) as shown in the AWG field 362, the ground conductor size of 12 as shown in GND field 364, the conduit size of ¾ in. as shown in C (IN) field 366, the percentage voltage drop of 3% as shown in the %VD field 368 and the maximum run-length distance of 90 ft. for the branch circuit conductor to satisfy the percent voltage drop indicated as shown in the FT field 370. In this fashion, a complete specification of a particular branch circuit is automatically provided by the spreadsheet of the present invention following the identification and input of a minimum set of input electrical data, i.e. load value, load type and number of poles, from which the desired electrical circuit variables are determined.

To complete the specification of the branch circuit panel board, the electrical system designer/spreadsheet user continues to input the minimum required data within center portion 350 for each of the plurality of branch circuits supported by that panel board. Following the input of the minimum set of data for each desired branch circuit, the remaining branch circuit variables are automatically calculated by the branch circuit panel board spreadsheet. As another example, the user may specify a branch circuit 117 for a stove 117 (FIG. 3) by entering specific data in lines 352-354. In the particular example of FIG. 4, the user specifies the total 3.0 kVA load in the kVA field 354 for each of the three different phases (branch circuits) associated with the stove. Further, the three-pole nature of the stove circuit is input on branch circuit line 352 in the P field 342, and the load type is identified as power load (P) in the macro field (MC) column 385. As with branch circuit 351, the branch circuit panel board module automatically calculates the circuit breaker trip value of 35 Amps with the wiring size of #8 AWG, a ground conductor size of #10 AWG, a conduit size of 1 in. and a percentage voltage-drop of 3%, resulting in a maximum run length of 92 feet.

After the user has input the necessary data for each branch circuit shown in center portion 350, the software of the present invention provides a summation function and summarizes the information related to each of the different load types in analysis region 380. Specifically, all of the loads and associated branch circuits of a particular load type are summed and reported within analysis region 380 to provide a total kVA load for each load type. In the example of FIG. 4, lighting loads identified with macro code L in both macro field (MC) columns 382 show a total load of 9.0 kVA, which is a summation of all L-type loads within center region 350.

Depending on the default demand factor which is pre-specified by the software according to electrical engineering constraints and standards data, e.g. electrical code requirements, a demand load or kVA is calculated by the software for the purpose of creating and calculating a total load for the branch circuit panel board. In the case of lighting loads L, which are permitted to have a 125% demand factor, the total demand of 11.3 kVA is provided by the software. After calculating all of the total demand kVAs, the spreadsheet/ branch circuit panel board module 10 of FIG. 1 sums the total demand of 58.1 kVA as shown at the bottom of analysis region 380 in demand kVA field 388. Optionally, the software enables a user to override the predetermined demand factors by entering an override value in field 387. Such an override would depend upon independently determined electrical design considerations which are often at the discretion of the user/electrical system designer responsible for designing a particular branch circuit panel board. Finally, the software of the present invention provides analysis notes 390 in analysis region 380 according to electrical engineering considerations associated with a particular load type. For example, if an inappropriate number of poles are selected for a particular branch circuit entry, then a note identifying the design error will automatically appear in the analysis notes section within field 390 associated with that particular load type. In alternative programming embodiments according to the present invention, the user may either be prohibited from or cautioned against further computations and advancement of the spreadsheet information until that error is rectified.

Once the total demand kVA is calculated within analysis section 380, this data is used to populate the fields within footer section 430 for other reporting purposes. In particular, the total calculated demand of 58.1 kVA from line 420 field 388 is presented in field 432 and from which is calculated the 161.3 total amperes required by the branch circuit panel board as shown in field 434. Also presented within footer section 430 are the total load (connected) of 56.7 kVA for the branch circuit panel board, as calculated in line 420 of field 384 and shown in footer section 436. From the total potential connected load, the total potential 157.4 amperes needed for the branch circuit panel board are calculated by the software and presented in field 438. Both the connected and calculated demand values are provided as an informational tool in aiding the system design engineer to provide data and to show local officials compliance with the associated electrical building codes.

Finally, the spreadsheet calculates the need for a step-down transformer, and if needed, will automatically calculate the minimum size step-down transformer required to provide the necessary amperes for the branch circuit panel board. In the example shown in FIG. 4, the calculated demand kVA is used to determine a step-down transformer kVA value of 75 kVA which provides a maximum demand amperage of 208.2, field 435. Once the step-down transformer size and the current carrying capacity of the step-down transformer has been determined, certain fields of header portion 318 within the branch circuit panel board module are determined to size the branch circuit panel board appropriately. As shown in FIG. 4, the step-down transformer requires that 208.2 amperes, field 435, be available which results in a minimum panel board mains rating value of 300 as shown in field 440. From this panel board mains rating, standards data and electrical codes are used to automatically determine and calculate values for the electrical conductor specification 350 AWG, field 442. Further, the #2 ground conductor size, field 444, the 3½ in. conduit size, field 446, the number of sets of wires, field 448, and the physical number of wires, field 450, are all determined or otherwise calculated. In addition, a 400 panel board frame size, field 454, a maximum permissible voltage drop of 2%, field 456, and a corresponding maximum conductor run length of 115 ft., field 458, are also determined or calculated by the spreadsheet according to the panel board mains maximum rating provided in field 440. Finally, based upon the conductor size provided in field 442, a calculated maximum feeder capacity of 310 Amps, field 439, is reported as the total feeder current capacity required for the feeder circuit associated with the branch circuit panel board of FIG. 4, i.e. feeder circuit 143 of FIG. 2.

As those of skill in the arts of electrical engineering and software programming will recognize, the software of the present invention provides an automated calculation mechanism by which individual characteristics of particular branch circuits within a particular branch circuit panel board may be easily modified. By altering one piece of input data, the associated calculations pertaining thereto and all subsequent determinations and calculations throughout the entire spreadsheet are repeatedly performed to provide a real-time output reflecting the updated input data. For example, if an additional branch circuit is specified within the branch circuit panel board, then the corresponding loads, conductor sizes and all other associated physical electrical characteristics needed to create that branch circuit would be provided by the software according to the present invention. Further, the software would then revise the previously-calculated total load values, total demand load values, required panel board mains rating sizes, panel board frame sizes, etc. so as to further refine the specification of that particular branch circuit panel board. It is precisely this iterative, bottom-up, automated approach to the specification of both the individual branch circuit characteristics and the branch circuit panel board that has been heretofore lacking from software of other electrical engineering calculation software programs.

FIG. 5 provides an exemplary subset of the data contained within database(s) 60 including a number of the user-specified field and software determined/calculated fields as described above with respect to the branch circuit panel board module in FIG. 4. As an example, a listing of the various branch circuit load type values 505-507 is shown. These load types reflect those presented to the engineer/user in field 382 of FIG. 4. Various physical attributes of the branch circuit panel boards are also provided including mounting types, shown in field 320 and having values of "surface" (value 508) or "recessed" (value 509), and phase-to-phase voltage values, shown in field 328 and having values of 480V, 208V, 240V. Similarly, the data shown in FIG. 5 and contained in database(s) 60 include all the various categories and corresponding values for many of fields provide in FIG. 4. Further, these data categories include both user-selectable inputs, such as the load type, field 382, as well as program generated outputs, such as wire AWG, field 362. In addition, certain data fields, for example, panel board frame in field 455, may be set to be either automatically selected, i.e. the AUTO value 515 shown in field 455, or the user may override the automatic selection to specify one of the remaining values. As an example, the branch circuit panel board panel frame field 454 of FIG. 4 is shown as set to automatic in field 455. If the user/engineer so desires, he or she may set field 455 in the branch circuit panel board module to automatically select the appropriate panel board frame size based on the calculated panel board mains rating provided in field 440. These automatic calculations and selections are performed by the software of the present invention based on the engineering equations 2, and other data within database(s) 60. However, the user may also select one of the alternative, defined values within the database field 455 of FIG. 5 as the value entry for branch circuit panel board frame field 455, either by under-specifying the panel, e.g. a 250 Amp panel board shown as value 512 FIG. 5, or by over-specifying the panel board, e.g. a 600 Amp panel as shown as value 514. According to one embodiment of the invention, these values are presented to and selected by the user in the form of drop-down boxes within the spreadsheet of FIG. 4. In this manner, and similar to other auto-selected fields, the user may either accept a pre-determined calculated value based on standard engineering calculations and electrical code data or may specify a user-selected value in contravention of the software's automatic selection.

Figures 6, 6A:
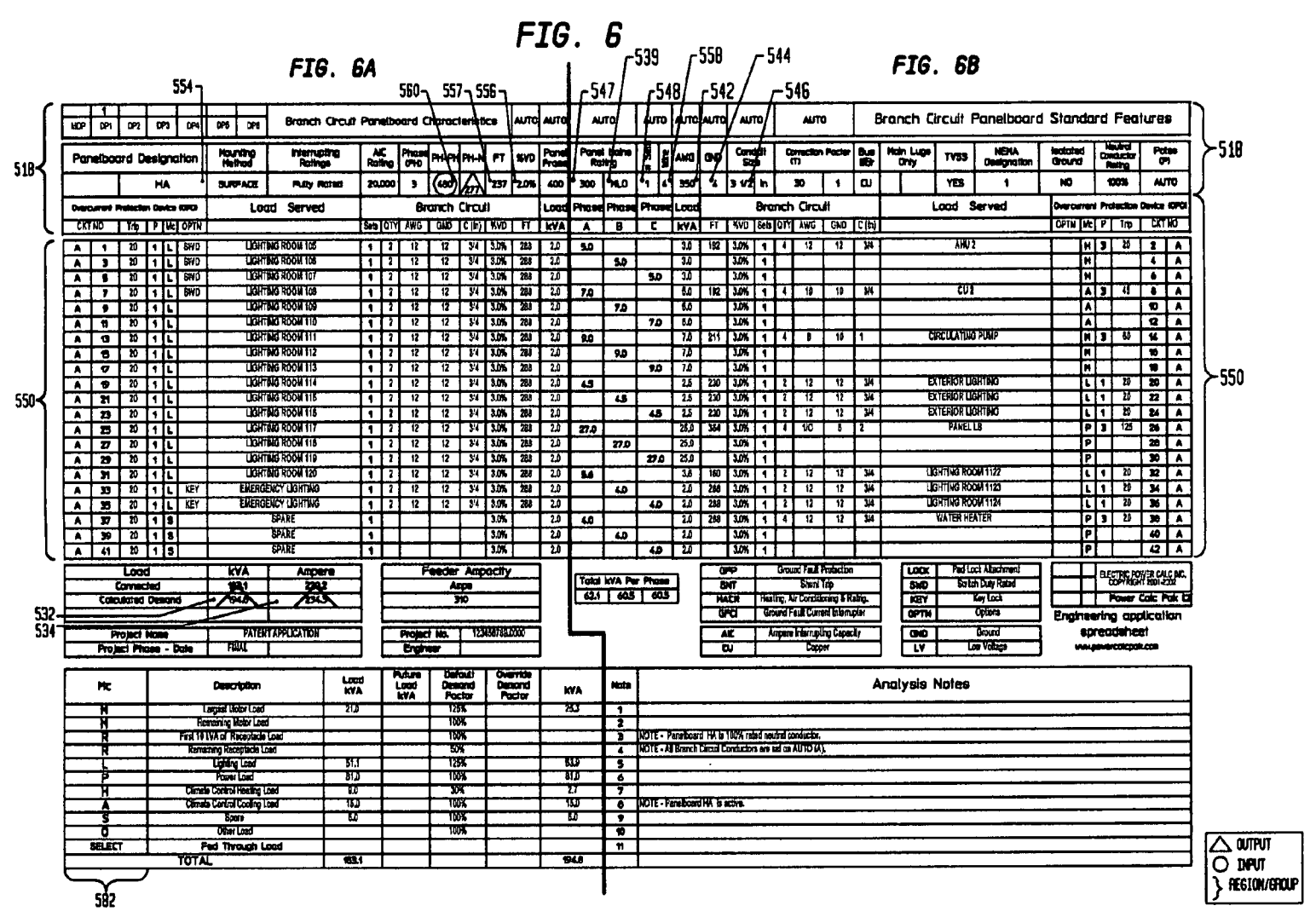

Referring to FIG. 6, a second branch circuit panel board spreadsheet is provided, as part of branch circuit panel board module 10. The branch circuit data of FIG. 6 shows the data associated with an additional branch circuit panel board 110 of FIG. 2. With respect to branch panel board HA 110 as designated in panel board designation field 554, one of the user-specified fields within header 518, the phase-to-phase voltage field 560 has been selected to be identical to the voltage provided by the distribution panel board 150 of FIG. 2, i.e. 480 volts. As with branch circuit panel board 111, the spreadsheet of FIG. 6, permits the user to input various loads in center section 550 such that the branch circuit panel board module automatically calculates the total load kVA for that panel board and provides the corresponding branch circuit and branch circuit panel board characteristics necessary to carry that load. This panel board is unlike the branch circuit panel board 111 of FIG. 2 as further shown in 310 of FIG. 4 in which the phase-to-phase voltage of 208V, field 328, was different from the voltage provided by distribution panel board 150 of FIG. 2. In branch circuit panel board of FIG. 2, a step-down transformer, 162 of FIG. 2, is required on 480V feeder 142 to provide a 208V feeder 143 to the branch circuit panel board. The requirement for this transformer is populated automatically by the software branch panel board circuit module 310 as shown by the AUTO value in field 539 of FIG. 4. In contrast, a step-down transformer is not needed for feeder circuit 140 of FIG. 2 to provide power to branch circuit panel board 110, as reflected by the lack of a step down transformer determination field area in the branch circuit panel board shown in FIG. 6. Consequently, and unlike the determination made in the spreadsheet of FIG. 4 for branch circuit panel board 111, the panel board mains rating is directly determined by the software of the present invention from the calculated demand amperes needed to support the panel; in this case, 234.3 Amps, as indicated at 534 of FIG. 6, are determined to be needed, which results in a panel board mains rating of 300 Amps, being automatically selected by the program, as indicated at 547 of FIG. 6.

In a like fashion, the software of the present invention would include as many spreadsheets as necessary for defining each branch circuit panel board in the overall electrical power distribution system shown in FIG. 2, in addition to specifying the physical characteristics of the components needed to construct each of the branch circuits and branch circuit panel boards.

Figure 7A:
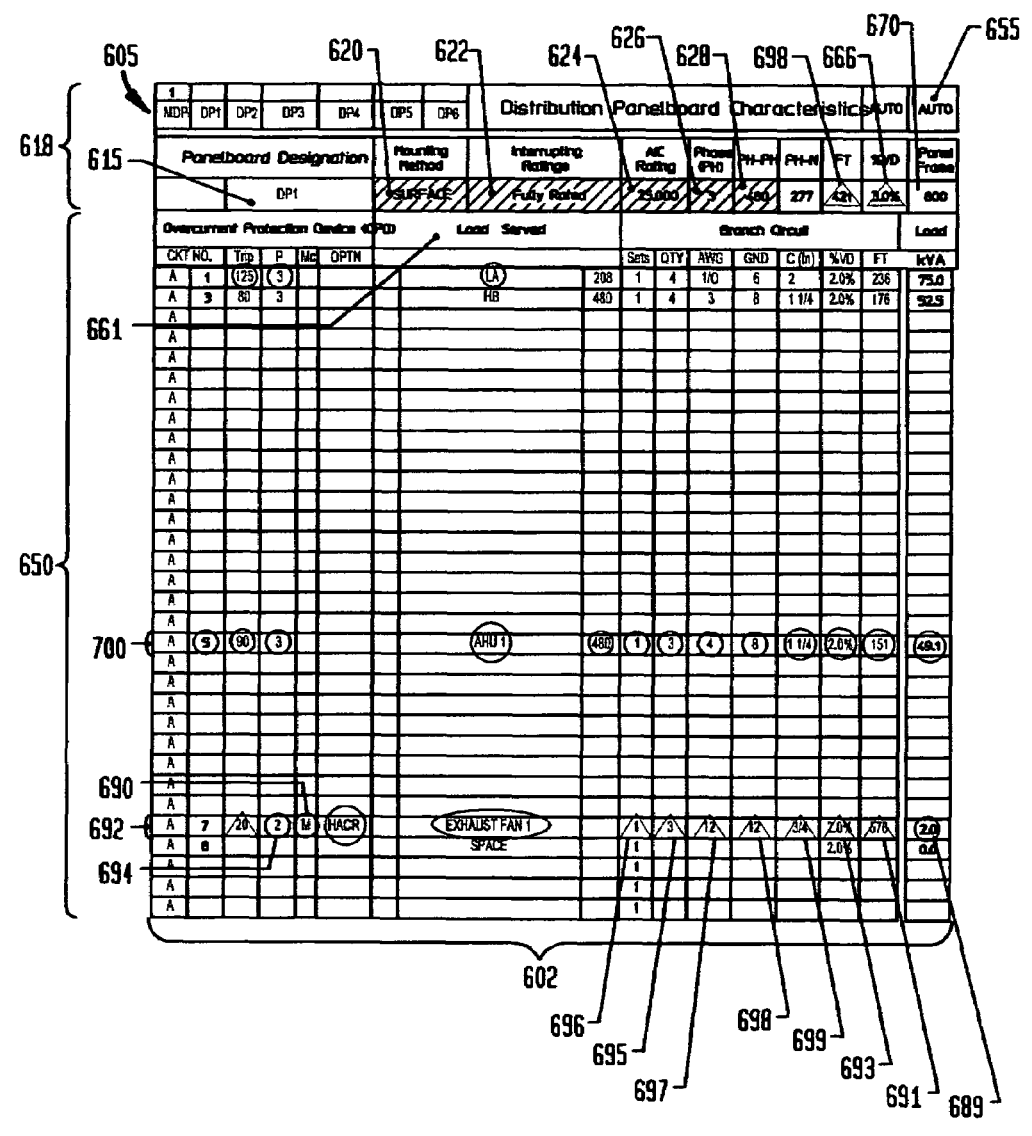
Figure 7B:
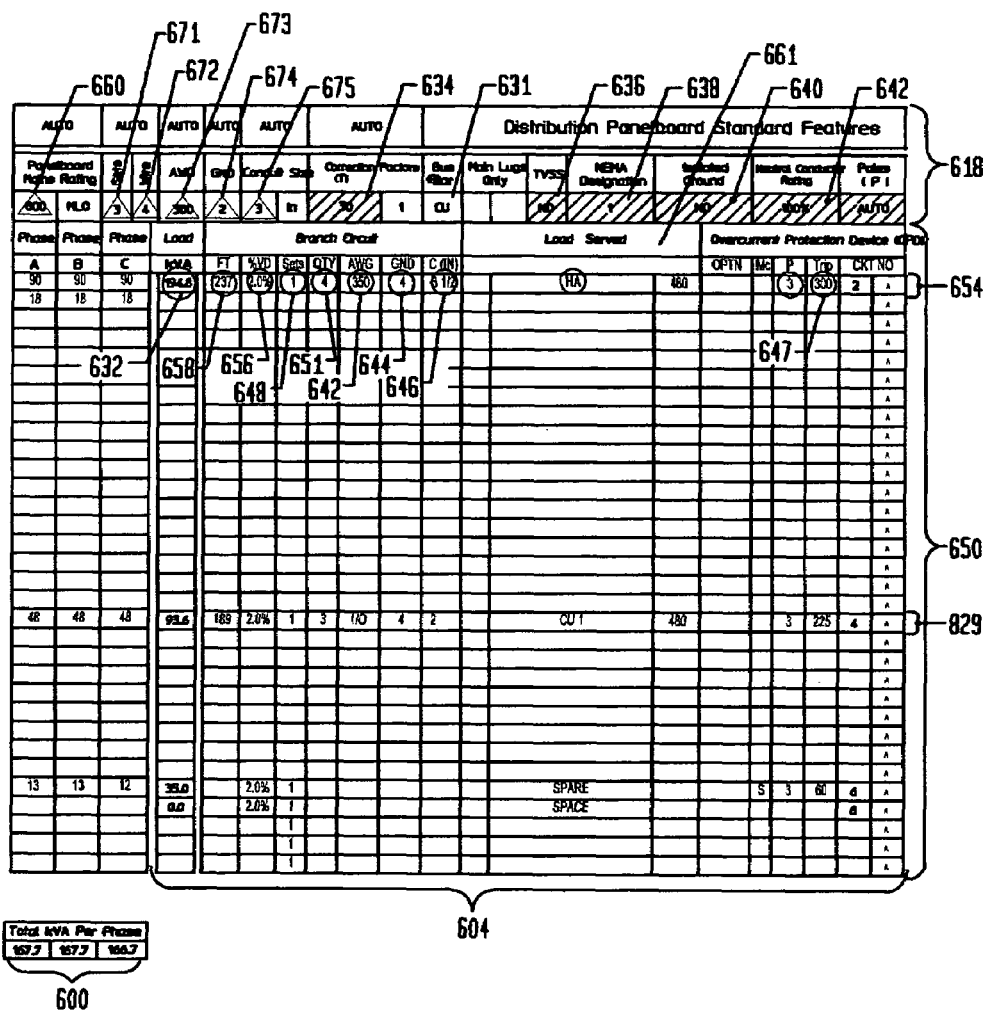
FIG. 7 is a screen shot of the distribution panel board module according to one embodiment of the present invention.
Figure 7D:
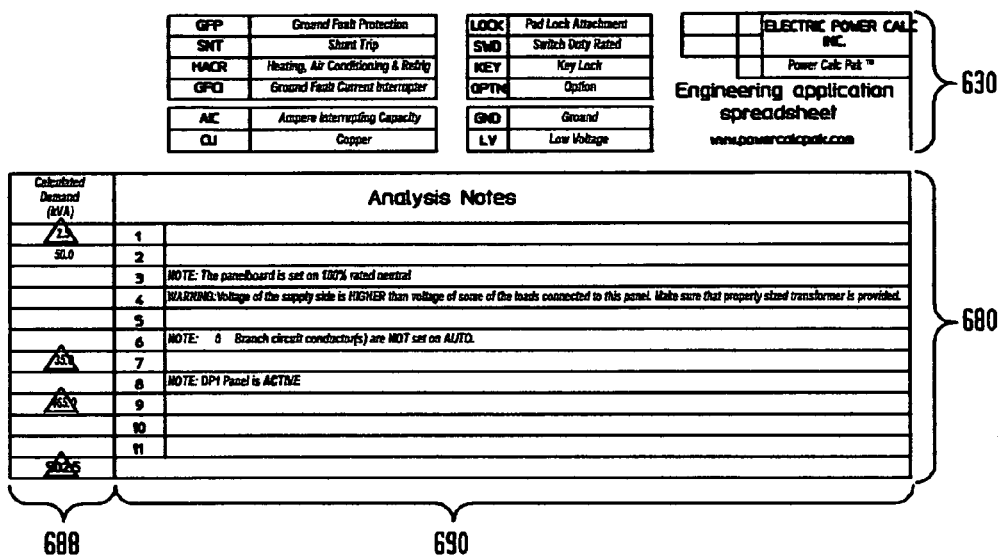

FIG. 7 provides an embodiment of the distribution panel board module 30 (FIG. 1) and the associated software. The distribution panel board module contains many of the same fields and associated calculations as presented in the branch circuit panel board module 10 in that the user specifies much of the same minimum subset of data related to the distribution panel board 150 of FIG. 2. This minimum subset of data may be the same or may be different from the minimum subset of data needed to specify each branch circuit depending on the electrical considerations in the design of the electrical power distribution system 100 of FIG. 2. For example, the load types shown in field 682 of FIG. 7, which are different from those in fields 382 and 582 of FIGS. 4 and 6 respectively, may require a different data subset which the software uses to determine the physical components necessary to construct the circuits that support those loads. Details of the minimum subset with respect to the particular example of FIG. 7 are provided below. Unlike the branch circuit panel board module, however, much of the minimum subset of data involved with the distribution panel board module of FIG. 7 is automatically transferred by the software from associated branch circuit panel board modules and values for corresponding circuit fields are automatically calculated based upon process described below. In this fashion, the design of the overall system is automated by the software and is performed on a "bottom level up" basis.

As with branch circuit panel board module, certain user-selected values are input to the distribution panel board module and are indicated by the shaded fields within the module of FIG. 7. In particular, the distribution panel board module consists of a header region 618, a center region 650, a footer region 630 and an analysis section 680. In the example shown in FIG. 7, panel designation DP1 is used to designate distribution panel board 150 of FIG. 2 in panel board designation field 615. Similarly the user/engineer specifies other values for data field within header region 618 to defining the characteristics of distribution panel DP1 include: the mounting method 620, the interrupting ratings 622, the AIC rating 624, the number of phases 626, and the phase-to-phase voltage for the distribution panel board 628. Further, the user may specify a current temperature correction factor 634, a bus bar type 631, the presence of a transient voltage surge suppression system device 636, the NEMA designation for the distribution panel board 638, the presence of an isolated ground for the panel 640, and the neutral conductor rating 642. As with the branch circuit panel board module of FIGS. 4 and 6, data values from database(s) 60 may be presented by the software in the form of drop-down boxes from which the user/engineer selects the desired parameters. Similar to the discussion above, many of these fields may be automatically provided for by the software by selecting an AUTO value from a particular field within the spreadsheet. For example, the activation of AUTO selection field 655 of panel board frame 670 will result in the software automatically selecting an appropriate value for the panel board frame based on the NEC data and calculations presented in the spreadsheet, in this case the total calculated demand amperes, field 685. Alternatively, the user may override the automatic selection by selecting a particular pre-defined value from the database 60.

Like the branch circuit panel board of FIGS. 4 and 6, center region 650 is also laid out so as to mimic the physical configuration of the distribution panel board itself in that a center field 600 identifies the three bar buss for that distribution panel board to support the three-phased buses associated with the distribution panel board. Further, the left distribution panel board column group 602 contains data related to the circuit breakers associated with the odd circuit breaker positions within the distribution panel board. Likewise, right distribution panel board column group 604 provides for the even numbered circuit breaker positions within the distribution panel board for connection to the central bus. As a general rule, the inputs to each panel board supported by the distribution panel board are shown in circles. The general outputs from the distribution panel board are shown in triangles.

The data within center region 650 of the distribution panel board module is automatically populated by the software of the present invention directly from the data generated within each of the individual branch circuit panel board modules as shown in FIGS. 4 and 6. Again, inputs on any sheet are shown in circles, whether provided manually by the software user or by other portions of the design software. Likewise, outputs from any sheet are shown in triangles. For example, distribution panel board entry 654, as identified by the HA value in the load served field 661, is automatically populated with the information from branch circuit panel HA 110 as calculated in the branch circuit panel board spreadsheet of FIG. 6. In particular, the total calculated demand of 194.8 kVA, as shown in field 532 of FIG. 6, is input by the software into field 632 of FIG. 7. Likewise, the automatically-calculated data within the header of panel board HA is input by the software into distribution panel board entry 654 within the distribution panel board module, including the maximum conductor run length (237 ft. of field 557 of FIG. 6) in field 658, the percentage voltage drop (2.0% of field 556 of FIG. 6) in field 656, the number of sets of conductors (1 of field 548 of FIG. 6) in field 648, the quantity of conductors (4 of field 558 of FIG. 6) in field 651, the AWG rating of the conductors (350 of field 542 FIG. 6) in field 642, the ground conductor size (4 of field 544 FIG. 6) in field 644, and the conduit size (3½ in. of field 546 of FIG. 6) in field 646. In addition, the total panel board mains rating (300 of field 547 of FIG. 6) is provided as the electrical break trip value shown in field 647 within distribution circuit panel board entry 654. Similar to the branch circuit panel board module, the distribution panel board spreadsheet automatically calculates a total connected load values, field 684, for each of the different load types, field 682, based on the data imported from the associated branch circuit panel board modules. After calculating a default-demand factor for each load, field 686, which may be overridden by the user, a total demand of 502.5 kVA is calculated as shown in field 688. Similar to the analysis field of the branch circuit panel board modules, analysis notes may automatically be generated in field 690 by the software so as to notify the user of improper input or data for the branch circuit panel board or outputs from the distribution panel boards.

To complete the spreadsheet, fields within footer region 630 are calculated by the distribution panel board spreadsheet based on the data concerning the total connected loads and total demand loads 684 and 688 respectively. Specifically, the distribution panel board module uses the calculated demand kVA values to determine an appropriate ampere rating for the distribution panel board as shown in field 685. This value is then used by the distribution panel board module to calculate a panel board mains rating, 800 in field 670, according to the electrical standards data and other engineering calculations. As with the branch circuit panel board, this panel board's calculated amperes is then used to calculate and determine the other electrical characteristics and physical requirements of the distribution panel board, including the maximum conductor length, 421 ft. of field 698, the overall panel board frame size, 800 of field 67, the number of sets of feeder conductors, 3 of field 671, the number of feeder wires necessary, 4 of field 672, the AWG rating of the feeder wires, 300 of field 673, the ground conductor size, 2 of field 674, and corresponding feeder conduit size, 3 in. of field 675.

As a user-friendly feature of the software of the present invention, the capability exists to independently add additional branch circuit information on a circuit-by-circuit basis, apart from the automatic population of branch circuit data from associated branch circuit panel board modules. For example, the exhaust fan 130 of FIG. 2 is shown in circuit entry line 692 on the left-hand side of the distribution panel board module. The data for this distribution panel circuit may be entered by the user by specifying certain minimum circuit characteristics such as the total load, value 2 kVA at 689, the number of poles for that circuit, value 2 at 694, and the load type, value M at 690. From this minimum set of information, just as with the branch circuit panel board module, the various electrical characteristics necessary to create that circuit that feeds the distribution panel board circuit are automatically calculated by the distribution panel board spreadsheet. In particular, the trip value 20 at entry circuit 692, the number of sets of conductors, 1 at 696, the number of conductors necessary for the feeder circuit, 3 at 695, the AWG rating of the conductors, 12 at 697, the ground conductor size, 12 at 698, the conduit size, ¾ in. at 699, the maximum allowable voltage drop, 2.0% at 693, and the corresponding maximum conductor length, 576 ft. at 691, are all calculated automatically by the spreadsheet based upon the user-input data. In this fashion, the distribution panel board is more flexible in that it may accept data from other modules such as the branch circuit panel board module as well as independent, user-specified, circuit data.

Figure 8:
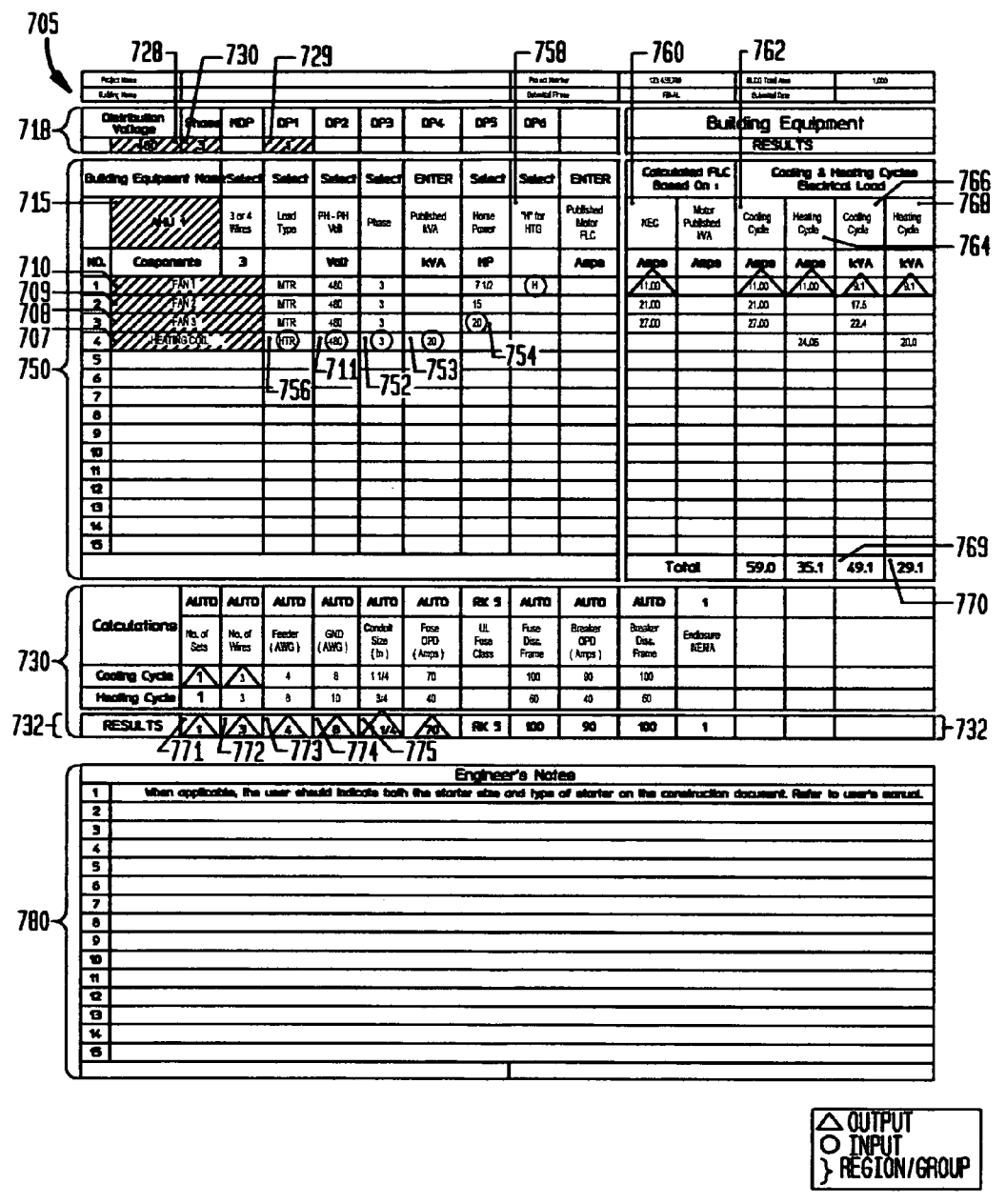

Building equipment module 20 provides another example of a circuit to be included within the distribution panel board module 30 of FIG. 1. In the electrical power distribution system of FIG. 2, such building equipment may include air conditioning unit 120 which might draw power from distribution panel board DP1 150. FIG. 8 provides one spreadsheet embodiment 705 for calculating the electrical component specifications for connecting this building equipment. Specifically, the building equipment module includes header portion 718, a center portion 750, a footer portion 730, and an engineer's notes section 780. In the header portion 718, certain user-input information is required to define the set of variables that permit the spreadsheet to calculate the remaining building equipment variables. This information is shown in the shaded fields in FIG. 8. In particular, the user must provide the distribution voltage, 480V at 728, and the distribution panel board designation to which the building equipment is to be connected, panel board DP1 at 729. In addition, the user must provide the number of phases required by the piece of building equipment, 3 at 730. Further input by the user, are a building equipment identifier (Building Equipment Name) 715, which indicates the piece of equipment being added, in the example of FIG. 8. The user then specifies a component identifier for each piece of building equipment, e.g. the above-mentioned air conditioning unit AHU 1 of field 715, including the subcomponents thereof, e.g. a HEATING COIL and FANs 1-3 of field 707-710. Further, for each subcomponent (e.g. the HEATING COIL) the user/engineer specifies a load type, HTR of 756, the phase-to-phase voltage, 480V at 711, the number of phases, 3 of 752, and the total power required, 20 kVA of 753. Alternative specifications of the power required may also be provided for by the software, from which standard equations and calculations may be used to arrive at common units of electrical power. For example, the horsepower requirements for the FANs are input as the power requirement 754 from which the Amps required to run the fans are determined by the software from the date and standards information within database(s) 60. From all the input data, the software of the present invention consults database 60, including the building electrical characteristic codes and engineering equations, to determine the rated current capacity needed for each of the different elements as shown in NEC field 760. In addition, separate cooling and heating electrical loads may be calculated by the software based upon the ampere rating 760 of a subcomponent to accommodate different functioning modes of the various building equipment components. In the example of FIG. 8 FAN1 may be used for both heating and cooling cycles as identified in field 758 from which different electrical current requirements for different operative cycles are provided by the software in fields 762 and 764. Based upon this information, total calculated demand loads (in kVA) may be calculated for heating cycles, cooling cycles, or any other appropriate operative cycle for a building equipment element or subcomponent thereof as shown in fields 766 and 768. The building equipment module then sums all such power requirements to provide total cooling and heating cycle demand loads as identified in fields 769 and 770.

The above-calculated building equipment total demand loads are then used to populate footer portion 730 of the building equipment module. As with the branch circuit panel board module 10 and the distribution panel board module 30, footer region 730 is used to calculate and compare the final output electrical parameters needed to create the appropriate feeder circuit connections and overcurrent protection so as to properly connect the building equipment to the distribution panel board. In particular, the number of sets of conductors, 1 at 771, the number of conductors, 3 at 772, the feeder conductor size, 4 at 773, the ground conductor rating, 8 at 774, the conduit size, 1¼ in. at 775 and the fuse size for overcurrent protection, e.g., element 134 of FIG. 2, are automatically calculated by the building equipment module. Based upon different operating constraints of the building equipment, for example, whether cooling cycles or heating cycles are being accounted for, the building equipment module selects the most demanding requirements for the building equipment and appropriately selects output values for each of these calculated values according to the maximum load condition for the system. As shown in line 732 of field 775 of the footer portion, for example, the more rigorous standard of 1¼ inch conduit size will be selected by the module as between the cooling cycle conduit size, determined to be a minimum of 1¼ inches, and the heating cycle conduit size, as determined to be a minimum of ¾ of an inch. Likewise, other data within the building equipment module are populated along the RESULTS line. In alternative embodiments of the software, the fields in footer portion 730 may programmable so as to be overridden by a user selection. Finally, engineering analysis notes are provided in section 780 of the building equipment module that notifies the user of error conditions and possible warnings regarding the connection of the building equipment. Optionally, the software may be programmed to prevent further data entry if these errors are not corrected in order to continue the design process.

As with the branch panel board module data, the building equipment spreadsheet 705 provides its data to the distribution panel board module as shown in the distribution panel board spreadsheet of FIG. 7 at line 700 of the left distribution panel board column group 602. As described above, this data is used by the distribution panel board module to calculate the necessary electrical characteristics of the building equipment including the proper sizing and selection of electrical components needed to construct the associated feeder circuits.

Referring to FIG. 9, another example of a building equipment spreadsheet associated with building equipment module 20 of the software of the present invention is provided. Specific to FIG. 9, the data associated with condenser unit 122 of FIG. 2, as identified by the indicator CU1 815, is calculated and specified. Much of the data in this building equipment module is similar to that shown in FIG. 8 with respect to the inputs, calculations and the outputs provided. In particular, a minimum set of user-defined inputs are provided as needed to derive outputs populated as shown on results line 832. Further, these results are also fed back to the distribution panel board module of FIG. 7 as input CU-1 shown in field 829 of FIG. 7, for further calculation and specification of appropriate electrical components for distribution panel board 150.

Figure 10B:
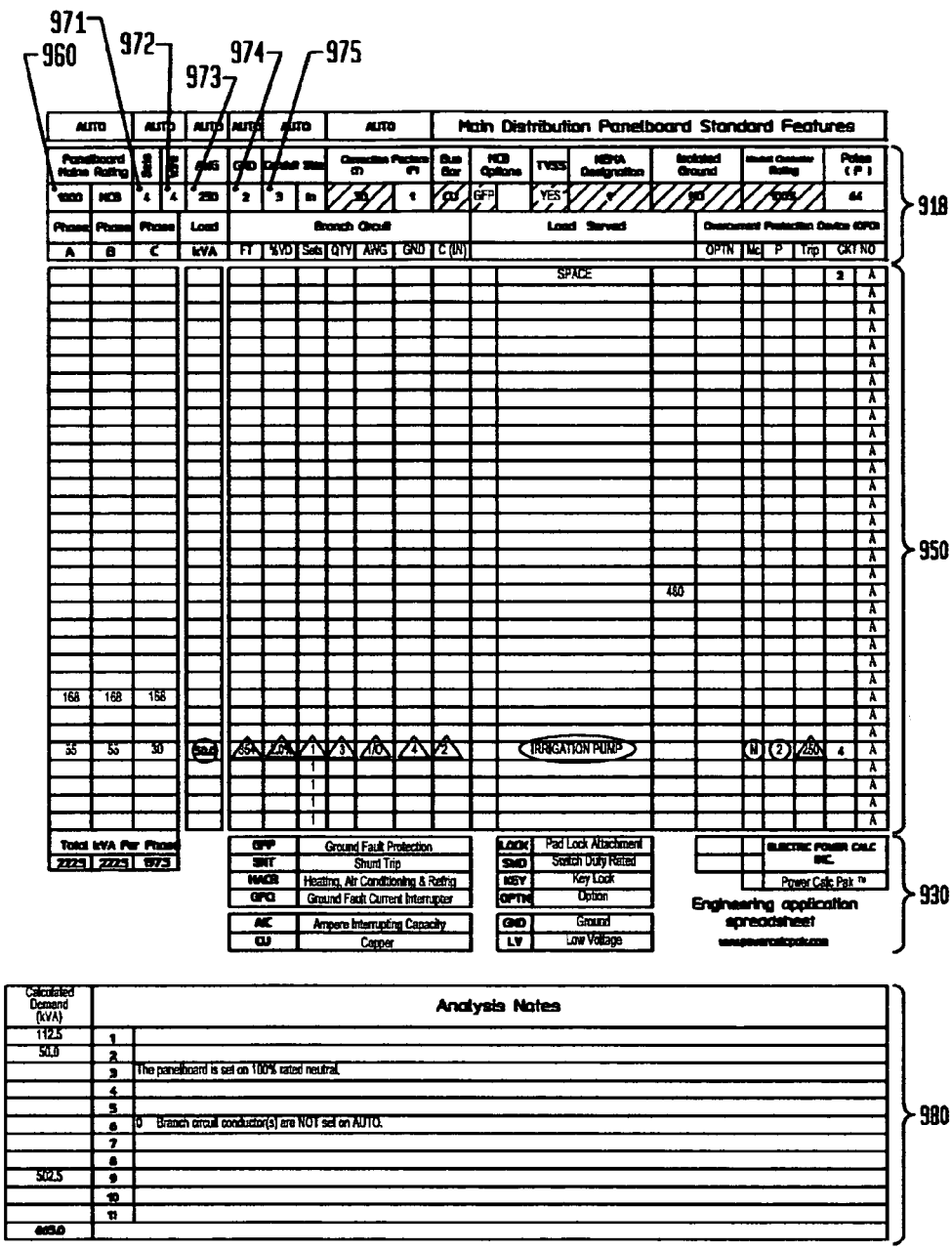
FIG. 10 is a screen shot of the main distribution panel board module according to one embodiment of the present invention.

FIG. 10 provides one embodiment of the main distribution panel board module 40 (FIG. 1) as a spreadsheet that which defines the electrical characteristics of the main distribution panel board 180 (FIG. 2). Main distribution panel board module 905 and its associated characteristics are very similar to those provided in distribution panel board spreadsheet 605 shown in FIG. 7. Specifically, the user/engineer inputs certain overall data into a header section 918 (shaded fields) which is used in conjunction with data fed from the distribution panel board spreadsheet(s), branch circuit panel boards, and building equipment, as fed into center section 950, so as to automatically calculate and provide the electrical specifications needed to create the connections for the main distribution panel board within the electrical power distribution system. Again, the layout of center section 950 mimics the actual physical layout of a main distribution panel board. Individual distribution panel board inputs, branch circuit panel board inputs and building equipment inputs are provided on a line-by-line basis within the main distribution panel board spreadsheet such that the main distribution panel board spreadsheet calculates and sums the total required demand kVA and amperes required for specifying the entire design of the main distribution panel board. As with the branch circuit panel board and distribution panel board specifications, analysis section 980 provides a list of selectable load types, which may require minimum subsets of input data different from those required for the branch and distribution panel boards to fully specify the electrical connections to the main distribution panel board. Analysis section 980 also provides and calculates default demand factors from which total demand loads are calculated. Analysis section also provides a section in which the software may provide automatic engineering warnings and announcements related to the various load types.

Similar to the discussion above with respect to branch circuit panel board 111 (FIG. 2), the software of the present invention may be programmed to determine the need for a service transformer 190 (FIG. 2) to connect the main distribution panel board 180 to the outside power primary circuit 196. Such a determination results from the voltage provided on the primary lines and a calculation of the total required amperes in footer section 930 of the main distribution panel board. Once the main distribution panel board module has calculated the appropriate service transformer size based upon the electrical engineering calculations and electrical codes contained within database 60, certain fields are automatically calculated within the header section 918, so as to fully specify the electrical design characteristics of the main distribution panel board. For example, as shown in FIG. 10, a panel board mains rating of 1000, field 960 has been determined as the minimum rating based upon a calculated service transformer value of 902.1 Amps calculated in field 934. Further, a panel board frame size, 1000 at 970, a maximum permissible voltage drop, 3.0% at 966, and a corresponding maximum transformer feeder conductor length, 323 feet at 998, are provided as outputs of the main distribution panel board spreadsheet. Further, the number of sets of conductors, 4 at 971, the number of feeder wires necessary, 4 at 972, the conductor size, 250 at 973, the ground conductor size, 2 at 974, and the conduit size for the transformer feeder, 3 in. at 975, are automatically calculated by the main distribution panel board spreadsheet. As such, the entire electrical specification of the physical and electrical parameters of the main distribution panel board may be provided to engineers and design personnel such that an appropriately sized main distribution panel board may be constructed and laid out according to building codes and accepted electrical engineering practices and equations.

Next will be described the series of steps performed by the software of the present invention in an exemplary calculation and determination of branch circuit variables and panel board value selections for a particular branch circuit. In these steps, numerous logical determinations, table look-ups and engineering calculations are required to be performed to make these determinations and further specify the physical characteristics of the electrical components of the branch circuit. It should be recognized within this world of equations, electrical standards and programmed decision making, that much of the implementation of the software of the present invention results in design choices being made that are at the discretion of the engineer and software programmer. Thus while one particular programming embodiment is described below, an infinite variation of alternative implementations are possible. Further, it is impractical to provide more than one example of a sample branch circuit calculation given the numerosity of the logical determinations and equation solving performed by the software described in this application. In essence, the panoply of calculations, determinations, table look-ups and discretionary judgments that are automatically calculated and programmed within the software are well known to those of skill in the arts of electrical engineering and software programming and are not critical to the basic invention(s) herein.

Referring back to branch circuit 215 of FIG. 3, i.e., branch circuit LA-14 of building 200, is shown as having four floor-based electrical outlets or receptacles for which a branch circuit is to be created. As previously described and shown in the branch circuit panel board spreadsheet of FIG. 4, three independent inputs are required from the user of the software of the present invention in order to make the remaining electrical calculations necessary to describe fully the entire branch circuit. First, the user/engineer must provide a load type 356, in this case, a "receptacle load" identified by the designation R in load selection field 382. Second the user/engineer must specify the number of poles used by this branch circuit. With reference to branch circuit 215 at FIG. 3, a single pole circuit shown as being input in field 358. Finally, the user/engineer specifies the total kVA load of branch circuit 215. For the kVA load, the user must add the individual loads required by each of the four receptacles to obtain a total kVA. In the example of FIG. 4, a load of 1.2 kVA has been arbitrarily determined. Once this minimum set of three branch circuit variables has been input by the user, the software of the present invention automatically calculates the remaining characteristics needed to specify the physical, electrical components needed to create that particular branch circuit.

The data pertaining to branch circuit 215 of FIG. 3 is provided on circuit line 351 of FIG. 4 where the above-mentioned minimum user inputs are identified as circled values. Based on the user selectable input provided at field 351, the software determines that the single pole determination provided in field 358 requires two conductors, one hot and one neutral, to carry the current that completes branch circuit 215. The software provides this at field 363 in line 351 of branch circuit 215 in FIG. 4. Further, based upon the 1.2 kVA load and the user-specified single pole circuit, which necessitates a phase-to-neutral voltage of 120 volts as determined by the spreadsheet from the datum shown at 344 of FIG. 4, it can be determined that a maximum of 10.0 Amps are required to be carried by branch circuit 215. This can be calculated from the electric power formula I=Electrical Load (kVA) times 1000/L-N Voltage (Line-Neutral) which is contained within the engineering equations library 2 of database 60. At this point, the software of the present invention refers to the trip rating table according to NEC standard 240-6, shown in FIG. 11. This table would typically be contained within the standards data 1 within database 60 in FIG. 1. From this table, the software determines that the inverse of 10.0 Amps results in a value that corresponds to a trip rating of 20 Amps, line 1010. This results in the selection of a 20 Amp circuit breaker for the branch circuit panel board to provide protection for branch circuit 215. Next, the electrical circuit size is determined based upon the previously determined circuit breaker size of branch circuit 215 and the user-specified temperature correction factor, field 334 of FIG. 4. Standard, values for the user-selectable temperature correction factors are provided in field 380 of FIG. 5. As shown in NEC table 310-16 provided in FIG. 12, a 20 Amp circuit breaker at 30 degrees results in the selection of a conductor size of 12, line 1110. This conductor size is also referred to as the AWG rating in NEC terminology. Although 14 is also an acceptable AWG rating, the particular embodiment of the software described herein is programmed to choose the more conservative value for circuit variables where a choice of more than one value is available according to the standard. The software of the present invention then automatically inputs the AWG value of 12 into field 362 of branch circuit line 351 (FIG. 4).

Next, the maximum conductor length is determined based on voltage drop selected by the user in field 456. According to NEC standards and good engineering practice, any particular stage of the electrical power distribution circuit of FIG. 2 may suffer a voltage drop of no greater than 5%. Thus if the user specifies a maximum of 2.0% voltage drop in the feeder to the branch circuit panel board, as selected by the user in field 456 of FIG. 4, then the software of automatically determines that a 3% voltage drop may be accepted within each of the individual branch circuits. Thus, the software automatically populates the voltage drop field 368 with 3.0% for each of the branch circuits. Once the maximum permissible voltage drop for each branch circuit is determined, the maximum conductor length for branch circuit 215 may be calculated by the software. In particular, the maximum conductor length is provided by the formula: $L=VD \times 1000/2 \times R \times I$, where VD=voltage drop, L=conductor length, R=conductor resistivity, and I=load current. Since the maximum current capacity of the branch circuit conductor (10.0A) and the maximum voltage drop (3.0%) have already been determined, the maximum conductor length can be determined by the software once the resistivity of the conductor is determined. In this regard, the software of the invention refers to NEC table 310-16 shown in FIG. 13 to determine that an AWG gauge wire of 12 at a temperature of 30 degrees has a maximum resistivity of 2.00, line 1210 of FIG. 13. It should be noted that the conductor resistivity is partially dependant upon the type of conduit in which the conductor is housed. This is reflected in the three different resistivities, one each for PVC, AL and steel, provided in NEC table 310-16 in FIG. 13. As mentioned above, the software of the present invention will make the most conservative determination in selecting circuit values where multiple choices are available. Thus, a maximum resistivity column is created within database 60 as shown in FIG. 13 from which all resistivities are selected. Thus once the resistivity is determined, the software calculates the maximum conductor length to be 90 feet which is displayed in the branch circuit panel board 310 at field 370 of line entry 351. Those of skill in the art will realize that this conductor length represents the maximum wire run length from the branch circuit panel board LA 111 in FIG. 2 to the farthest of the electrical receptacles in branch circuit 215.

Next, the ground conductor, size is determined by the software with the aid of NEC tables 250-66 and 250-122 provided in FIG. 14. According to precise adherence to the NEC code, two different tables are used to determine the proper ground conductor size depending on whether the ground conductor is to be used for the mains or service line or somewhere else within the electric power distribution system. In the example of branch circuit 215, the ground conductor determination is made with the assistance of NEC table 250-122. Further, the selection of a ground conductor size, like the power conductor determination above, is dependant upon the circuit breaker size, in this case 20. In addition, the ground wire conductor size is dependant upon the type of metal used for the branch circuit panel board bus bar, and thus the ground conductor wire. Thus, for branch circuit 215 having circuit breaker size 20, field 360, and a copper bus bar, field 330, the ground wire conductor size is selected by the software to be 12, line 1310 of FIG. 14. This is provided by the software in field 364 for branch circuit 215 on line 351 in FIG. 4.

Next, the conduit size for the conductors is determined by the software based upon the number of conductors and the AWG rating of each conductor as provided above. Referring back to FIG. 13, the NEC code provides a cross sectional area for each conductor based on the AWG size of the conductor. For the 12 AWG hot and neutral conductors, line 1210 of FIG. 13 shows the cross sectional area of the conductor to be 0.0117 in. Commensurate with the conservative nature of the software of the present invention, one additional conductor cross section is added to the sum of the conductors' cross sections within a branch circuit as a safety margin for fit. Given the two conductors determined above, field 363 of FIG. 4, plus a third "safety conductor" the total conductor cross section is determined to be 0.0351. Based on the NEC rules and formulae for conduits, as provided in FIG. 15, the software determines that 1/(sum of the total conductor area/0.4) is 11.396 which results in the selection of a ¾ in. conduit, line 1410. This selection is presented at field 366 in line 351 for branch circuit 215.

Once all branch circuits are specified as described above, the branch circuit panel board spreadsheet is completed by the software as follows. First, the branch circuit loads for each of the load types in field 382 are summed and displayed by the software in field 384 of FIG. 4. Second, each of the total loads values are multiplied by the default demand factor for that load type, field 386, to arrive at a total demand kVA for each load type, field 388 of FIG. 4. The default demand factors for particular load types may be selected by the software of the present invention according to standards data within database 60 or alternatively, may be overridden by the user/engineer. Third, the total demand kVAs are then summed to provide a final, total demand kVA for the entire branch circuit panel board, field 388. After calculation of the total demand kVA, for example 58.1 kVA of FIG. 4, the total demand kVA is provided by the spreadsheet within the footer region 430, field 432. The software then applies electrical power equations to arrive at the total number of amperes required for the branch circuit panel board, e.g. 161.3 amps in field 434. For the engineer's reference, and strictly for the purpose of comparing the total possible demand load to the total probable demand load, the total, load kVA, unmitigated by the demand factor, is also calculated and presented in the footer region 430, e.g. 56.7 kVA at field 436. Depending on the presence of a step-down transformer, which may modify the total required amperes as shown at field 435 in the spreadsheet of FIG. 4, the spreadsheet then determines the total number of amperes needed by branch circuit panel board 111 and compares this to NEC tables to arrive at a main panel board rating. In the example of FIG. 4, the engineer and software have determined that a transformer is needed, see field 539, and the total required amperes are calculated to be 208.2A. The next highest mains panel board rating of 300 (Amp), field 440 FIGS. 4 and 5, is then selected by the software to support that particular calculated demand load.

Next, the software calculates a number of electrical characteristics involving the feeder circuits 143 of branch circuit panel board 111 of FIG. 2 based upon the total number of amperes by that panel board. These calculations result in the determination of feeder wire characteristics. Specifically, the number of sets of wires 448, the number of wires 450, the rating of the wires 442, the ground conductor size, 444 and the conduit size 446 respectively, are determined according to NEC tables and formulas similar to the previously described process involving the branch circuits. As is well known in the art, the determination of feeder circuit characteristics may need to be performed according to different NEC tables and codes, as well as different engineering calculations in arriving at the appropriate data, although many of the calculations are similar to those used to determine the branch circuit values. In addition, certain physical characteristics of the branch circuit panel boards are determined according to standard manufactured sizes, and not necessarily NEC-determined values. In particular, the panel board frame, field 454, is selected according to a table of standard manufacturer panel board sizes and in accordance with the calculated panel board mains rating and standard frame size formulas, field 440. Finally, the maximum length of feeder wire is calculated, field 458, to determine a maximum length of 115 feet for the feeder conductors to the branch circuit panel board.

Similar to the specification of a minimum subset of circuit variables for branch circuits, minimum subsets of circuit variables for a distribution panel board may be provided so as to fully define the electrical characteristics and physical electrical components needed to construct the distribution panel board and the associated feeder circuits. As shown in FIG. 7, e.g. line 654, the distribution panel board requires the kVA input of each of the individual feeder circuits from the branch circuit panel boards so as to calculate a total connected load for each of the different branch circuit panel board load types. In addition, distribution panel board 605, FIG. 7, sums each of the individual branch circuit panel board load types so as to arrive at a total connected and total calculated demand load, fields 684 and 688 for the distribution panel board. These calculations are performed in a manner similar to those calculated for the branch circuit panel board described above. From a total calculated demand load, e.g. 502.5, the total demand amperes are calculated, e.g. 604.4 field 685. As is known by those skilled in the art and similar to the analogous branch circuit panel board calculations illustrated above, the software of the present invention performs the additional calculations needed to arrive at the conduit sizing, panel board mains rating and maximum feeder length for the distribution panel board in accordance with NEC code and standard electrical engineering calculations.

One particular advantage of the software embodiment of this particular invention is that the output data created by the software may be exported to other software modules which provide analysis functions and other circuit determination functions so as to determine a proper operation of the circuit. While the present invention is focused on a bottom-up, specification of the components of an electrical power distribution system, an overall electrical circuit evaluation for each one of the individual branch and feeder circuits, as well as the main and distribution panel board operation, are adequately covered and well-known in the art. Those of skill in the art will appreciate that the data within this invention is easily exported from the spreadsheets of the current program and provided, for example in PDF format, to other standard programs that can perform electrical simulation analyses to determine the proper operation of the circuits and panel boards.

Figure 16:
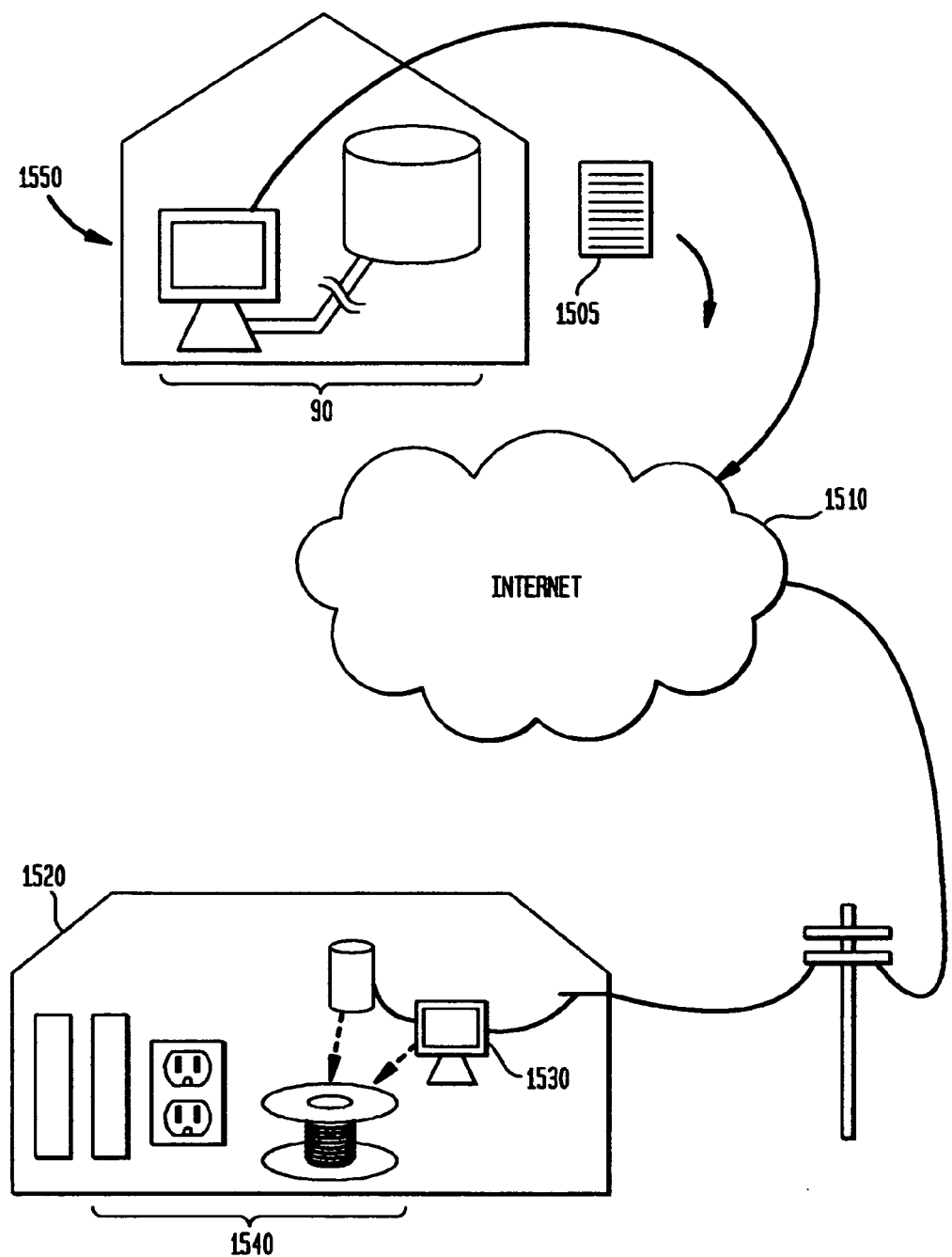
FIG. 16 is a general diagram depicting the electronic transmission of electrical inventory requirements to a component supplier according to one embodiment of the present invention.

As a further advantage of the software of the present invention, and unlike any other heretofore known software, its output data consist of the physical specifications for the electrical components required to construct an electrical distribution system. As such, this specification of physical, electrical components, may be easily translated into standard inventory lists that are capable of being remotely transmitted to distribution warehouses so that the necessary electrical components are automatically delivered to a construction site. FIG. 16 provides one example of such an arrangement. For example, a user of the software system 90 may specify the minimum set of variables for each of a set of branch circuits, thereby constructing a branch circuit panel board according to the description given above. Once the conductor lengths, panel board sizes, conduit sizes and all other physical specifications for the electrical system components have been specified, actual electrical component parts lists 1505 may be generated by system 90, possibly with the aid of an inventory database 5 that may be part of database(s) 60, FIG. 1. This parts list may then be transmitted over the internet 1510, possibly through a web-based interface, directly to a supplier of electronic components 1520. At the suppliers, the received parts list may be correlated with the standard parts lists by the suppliers own computer systems 1530. These computer systems can them perform a check for the requested parts against existing inventory within the supplier's establishment 1540. As a result of this comparison, an inventory list derived from and fully-satisfying the list of needed electrical components may be generated to construct the electrical distribution system. Such inventories, for example, may be provided by standard electrical contracting houses, Home Depot, or other distributors of electrical equipment. Once the inventory list is created by the electrical component distribution company, the components may then be automatically picked and shipped to the desired location, or directly to the job site 1550. This direct delivery approach minimizes the time, effort and expense in generating independent inventory lists and reduces the lag time in constructing the actual electrical power distribution systems.

As an alternative to the electrical component supplier generating the inventory list, the electrical suppliers themselves may publish electronic inventories with prices. Users of the software of the present invention would then be able to download the inventory lists directly to their databases 60 so that standard component lists may be generated directly by the user/engineer. Price comparison among different suppliers would be facilitated with this arrangement since the user would be in possession of the end parts list of needed components.

As is well known in the art, the software of the present invention may be embodied in a number of formats, including storage on a hard disk drive, or imprinting onto a CD-ROM, floppy disc or ZIP drive. Alternatively, the software of the present invention may be provided on a web-based interface for download and use on either a project-by-project basis, or alternatively, as a repetitively useable fully-licensed software package. As appreciated by those of the skill in the art, modifications to existing electrical circuits may be easily updated once the software for the present invention is populated with appropriate data for existing electrical power distribution systems, thereby simplifying the addition of additional branch circuits and/or the expansion of the electrical system to additional branch circuit panel boards, distribution panel boards and/or main distribution panel boards.

Although various preferred embodiments of the present invention have been disclosed for illustrative purposes, those skilled in the art will appreciate that various modifications, additions and/or substitutions are possible without departing from the scope and spirit of the present invention as disclosed in the claims. In this regard, the invention of the present invention is not limited in any way in the use of any particular existing other heretofore developed standards data, design criteria, engineering equations or other data. Although the NEC has been used as an example throughout the specification, other existing standards may be used instead of, or in combination with the NEC data. One such alternative standard is the SI (Standards International) system used in Europe. Further, different building standards and design data may be used such as the Canadian building standard.

The invention claimed is:

1. A general-purpose computer-based system for designing an electrical power distribution system for a building, said system comprising:
   a standards database containing standards data associated with an electrical standard for buildings;
   a panel design module for accepting a minimum subset of panel board data for a panel, said panel having a set of panel variables that, in combination with said minimum subset of panel board data, defines said panel;
   a circuit design module for accepting a minimum subset of branch circuit data for each of a plurality of branch circuits, said branch circuits for distributing electrical power within said building, each branch circuit having a set of branch circuit variables that, in combination with said minimum subset of branch circuit data, defines said branch circuit;
   wherein said circuit design module determines branch circuit values for said branch circuit variables using said minimum subset of branch circuit data in connection with said standard data; and
   wherein said panel design module determines panel values for said panel variables using said branch circuit values for said plurality of branch circuits, said minimum subset of panel board data, and said standards data; and
   wherein said panel design module automatically recalculates at least one panel value for a corresponding panel variable in connection with said standards data when another one of said previously determined panel values is changed.

2. The general-purpose computer-based system of claim 1 wherein said minimum subset of branch circuit data include at least one of: a load type, a kVA load, a voltage or a phase value for each of said branch circuits.

3. The general-purpose computer-based system of claim 1 wherein said set of branch circuit variables includes at least one of: a branch circuit breaker size, a branch circuit conductor size, a number of branch circuit conductors, a branch circuit ground conductor size, a maximum branch circuit length, a branch circuit conduit size, or a voltage drop.

4. The general-purpose computer-based system of claim 1 wherein said minimum subset of panel board data includes at least one of: a panel voltage value, a panel mounting type, a panel interrupting rating, an ampere interrupting capacity rating, a number of phases, a temperature correction factor, a bus bar type, a TVSS device, a National Electrical Manufacturers Association designation, an isolated ground, a neutral feeder conductor rating, or a number of poles.

5. The general-purpose computer-based system of claim 1 wherein said set of panel variables includes at least one of: a total panel capacity, a panel mains rating, a feeder conducting size, a number of feeder conductors, a number of feeder sets, a maximum feeder length, a feeder ground conductor size, a feeder conduit size or a voltage drop.

6. The general-purpose computer-based system of claim 1 wherein said electrical standard for building is an electrical code.

7. The general-purpose computer-based system of claim 1 wherein said electrical standard for buildings is an electrical code and said standards data includes local variations to the electrical code.

8. The general-purpose computer-based system of claim 1 wherein said minimum subset of branch circuit variables includes a load type and said panel design module determines a demand load as part of said panel definition based on said standards data and said load type, said panel values being further determined by said demand load.

9. The general-purpose computer-based system of claim 1 further comprising a building equipment module for accepting a minimum subset of building equipment data for each of a plurality of building equipment, each building equipment constituting one of said branch circuits within said building, wherein said building equipment module determines branch circuit values for said branch circuit variables on said branch circuits containing building equipment using said minimum subset of building equipment data in connection with said standards data.

10. The general-purpose computer-based system of claim 9 wherein said building equipment includes at least one of: a fan, a heating coil, a pump, a compressor, a motor-driven equipment or an air conditioner.

11. A method for designing an electrical power distribution system for a building using a computer-based system, said computer-based system performing the steps of:
   specifying a set of branch circuit variables that define a branch circuit, said branch circuit for distributing electrical power within said building;
   specifying a set of panel variables that define a panel;
   inputting a minimum subset of panel board data, and repetitively
      inputting a minimum subset of branch circuit data for a said branch circuit;
   calculating branch circuit values for each of said branch circuit variables based on said minimum subset of branch circuit data using a standards database containing standards data associated with an electrical standard for buildings;

calculating panel values for each of said panel variables based on said minimum subset of panel board data and said calculated branch circuit values using said standards data;

changing at least one of said previously calculated panel values; and recalculating automatically another one of said panel values for a corresponding panel variable in connection with said standards data and in response to said changed panel value.

12. The method of claim 11 wherein said step of changing at least one of said previously calculated panel values further comprises manually overriding by a system user said previously calculated panel value.

13. The method of claim 11 wherein said step of changing at least one of said previously calculated panel values further comprises replacing said previously calculated panel value with a subsequently calculated panel value.

14. The method of claim 11 further comprising displaying analysis notes, said analysis notes including at least one of an error message, a warning message, or a design suggestion associated with said branch circuit.

15. The method of claim 11 wherein said step of specifying a set of branch circuit variables includes specifying a load type, said step of calculating panel values includes calculating a demand load based on said load type and said standards data and wherein said panel values are calculated using said demand load.

16. The method of claim 11 further comprising
specifying a minimum set of building equipment variables that define a building equipment on one of said branch circuits;
inputting a minimum subset of building equipment data for said building equipment;
calculating building equipment values for said building equipment variables based on said minimum subset of building equipment data using said standards database containing standards data; and
calculating branch circuit values for each of said branch circuit variables for said branch circuit containing said building equipment.

17. The method of claim 11 wherein the steps of claim 11 are performed by said computer-based system in accordance with at least one computer program stored in a computer-readable media, said computer program having a plurality of code sections that are executable by said computer-based system.

18. The general-purpose computer-based system for designing an electrical power distribution system for a building, said system comprising:
a standards database containing standards data associated with an electrical standard for buildings;
a panel design module for accepting a minimum subset of panel board data for a panel, said panel having a set of panel variables that, in combination with said minimum subset of panel board data, defines said panel;
a circuit design module for according a minimum subset of branch circuit data for each of a plurality of branch circuits, said branch circuits for distributing electrical power within said building, each branch circuit having a set of branch circuit variables that, in combination with said minimum subset of branch circuit data, defines said branch circuit; and
wherein said circuit design module determines branch circuit values for said branch circuit variables using said minimum subset of branch circuit data in connection with said standards data;
wherein said circuit design module automatically recalculates at least one branch circuit value for a corresponding branch circuit variable in connection with said standards data when another one of said previously determined branch circuit values is changed; and
wherein said panel design module determines panel values for said panel variables using said branch circuit values for said plurality of branch circuits, said minimum subset of panel board data, and said standards data.

19. The general-purpose computer-based system of claim 18 wherein said minimum subset of branch circuit data include at least one of: a load type, a kVA load, a voltage or a phase value for each of said branch circuits.

20. The general-purpose computer-based system of claim 18 wherein said set of branch circuit variables includes at least one of: a branch circuit breaker size, a branch circuit conductor size, a number of branch circuit conductors, a branch circuit ground conductor size, a maximum branch circuit length, a branch circuit conduit size, or a voltage drop.

21. The general-purpose computer-based system of claim 18 wherein said minimum subset of panel board data includes at least one of: a panel voltage value, a panel mounting type, a panel interrupting rating, an ampere interrupting capacity rating, a number of phases, a temperature correction factor, a bus bar type, a TVSS device, a National Electrical Manufacturers Association designation, an isolated ground, a neutral feeder conductor rating, or a number of poles.

22. The general-purpose computer-based system of claim 18 wherein said set of panel variables includes at least one of: a total panel capacity, a panel mains rating, a feeder conductor size, a number of feeder conductors, a number of feeder sets, a maximum feeder length, a feeder ground conductor size, a feeder conduit size or a voltage drop.

23. The general-purpose computer-based system of claim 18 wherein said electrical standard for buildings is an electrical code.

24. The general-purpose computer-based system of claim 18 wherein said electrical standard for buildings is an electrical code and said standards data includes local variations to the electrical code.

25. The general-purpose computer-based system of claim 18 wherein said minimum subset of branch circuit variables includes a load type and said panel design module determines a demand load as part of said panel definition based on said standards data and said load type, said panel values being further determined by said demand load.

26. The general-purpose computer-based system of claim 18 further comprising a building equipment module for accepting a minimum subset of building equipment data for each of a plurality of building equipment, each building equipment constituting one of said branch circuits within said building, wherein said building equipment module determines branch circuit values for said branch circuit variables on said branch circuits containing building equipment using said minimum subset of building equipment data in connection with said standards data.

27. The general-purpose computer-based system of claim 18 wherein said building equipment includes at least one of: a fan, a heating coil, a pump, a compressor, a motor driven equipment or an air conditioner.

28. A method for designing an electrical power distribution system for a building using a computer-based system, said computer-based system performing the steps of:
specifying a set of branch circuit variables that define a branch circuit, said branch circuit for distributing electrical power within said building;
specifying a set of panel variables that define a panel;

inputting a minimum subset of panel board data, and repetitively
    inputting a minimum subset of branch circuit data for a said branch circuit;
    calculating branch circuit values for each of said branch circuit variables based on said minimum subset of branch circuit data using a standards database containing standards data associated with an electrical standard for buildings;
changing at least one of said previously calculated branch circuit values;
recalculating automatically another one of said branch circuit values for a corresponding branch circuit variable in connection with said standards data and in response to said changed branch circuit value; and
calculation panel values for each of said panel variables based on said minimum subset of panel board data and said calculated and recalculated branch circuit values using said standards data.

29. The method of claim 28 wherein said step of changing at least one of said previously calculated branch circuit values further comprises manually overriding by a system user said previously calculated branch circuit value.

30. The method of claim 28 wherein said step of changing at least one of said previously calculated branch circuit values further comprises replacing said previously calculated branch circuit value with a subsequently calculated branch circuit value.

31. The method of claim 28 further comprising displaying analysis notes, said analysis notes including at least one of an error message, a warning message, or a design suggestion associated with said branch circuit.

32. The method of claim 28 wherein said step of specifying a set of branch circuit variables includes specifying a load type, said step of calculating panel values includes calculating a demand load based on said load type and said standards data and wherein said panel values are calculated using said demand load.

33. The method of claim 28 further comprising
specifying a minimum set of building equipment variables that define a building equipment on one of said branch circuits;
inputting a minimum subset of building equipment data for said building equipment;
calculating building equipment values for said building equipment variables based on said minimum subset of building equipment data using said standards database containing standards data; and
calculating branch circuit values for each of said branch circuit variables for said branch circuit containing said building equipment.

34. The method of claim 28 wherein the steps of claim 28 are performed by said computer-based system in accordance with at least one computer program stored in a computer readable media, said computer program having a plurality of code sections that are executable by said computer-based system.

35. Computer-readable media storing program code that when executed by a processor within a computer-based system for designing an electrical power distribution system for a building, said program code performs the steps of:
specifying a set of branch circuit variables that define a branch circuit, said branch circuit for distributing electrical power within said building;
specifying a set of panel variables that define a panel;
inputting a minimum subset of panel board data, and repetitively
    inputting a minimum subset of branch circuit data for said branch circuit;
    calculating branch circuit values for each of said branch circuit variables based on said minimum subset of branch circuit data using a standards database containing standards data associated with an electrical standard for buildings;
calculating panel values for each of said panel variables based on said minimum subset of panel board data and said calculated branch circuit values using said standard data;
changing at least one of said previously calculated panel values; and
recalculating automatically another one of said panel values for a corresponding panel variable in connection with said standards data and in response to said changed panel value.

36. Computer-readable media storing program code that when executed by a processor within a computer-based system for designing an electrical power distribution system for a building, said program code performs the steps of:
specifying a set of branch circuit variables that define a branch circuit, said branch circuit for distributing electrical power within said building;
specifying a set of panel variables that define a panel;
inputting a minimum subset of panel board data, and repetitively
    inputting a minimum subset of branch circuit data for a said branch circuit;
    calculating branch circuit values for each of said branch circuit variables based on said minimum subset of branch circuit data using a standards database containing standards data associated with an electrical standard for buildings;
changing at least one of said previously calculated branch circuit values;
recalculating automatically another one of said branch circuit values for a corresponding branch circuit variable in connection with said standards data and in response to said changed branch circuit value; and
calculating panel values for each of said panel variables based on said minimum subset of panel board data and said calculated and recalculated branch circuit values using said standards data.

* * * * *